(12) United States Patent
Tomikawa et al.

(10) Patent No.: US 8,773,958 B2
(45) Date of Patent: Jul. 8, 2014

(54) ESTIMATION METHOD OF CURIE TEMPERATURE DISTRIBUTION WIDTH

(75) Inventors: Satoshi Tomikawa, Tokyo (JP); Tomohito Mizuno, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 13/568,572

(22) Filed: Aug. 7, 2012

(65) Prior Publication Data

US 2014/0043707 A1  Feb. 13, 2014

(51) Int. Cl.
  *G11B 11/00*  (2006.01)
(52) U.S. Cl.
  USPC ................................ 369/13.33; 369/13.13
(58) Field of Classification Search
  USPC ............. 360/59, 31; 369/13.33, 13.13, 13.32, 369/13.02, 13.17; 385/129
  See application file for complete search history.

(56) References Cited

U.S. PATENT DOCUMENTS

| | | | |
|---|---|---|---|
| 6,680,609 B1 | 1/2004 | Fang et al. | |
| 6,801,377 B2 | 10/2004 | Kasajima et al. | |
| 6,989,949 B2 | 1/2006 | Cheng et al. | |
| 7,119,537 B2 | 10/2006 | Che et al. | |
| 7,843,658 B2 | 11/2010 | Kiyono | |
| 2006/0181799 A1* | 8/2006 | Inomata | 360/59 |
| 2008/0043359 A1* | 2/2008 | Chung et al. | 360/59 |
| 2012/0232831 A1* | 9/2012 | Mizuno et al. | 702/130 |

FOREIGN PATENT DOCUMENTS

JP  2000-11336 A  1/2000

OTHER PUBLICATIONS

Relationship Between High Density Recording Performance and Oarticle Coercivity Distribution, Tagawa et al, IEEE vol. 27, No. 6, Nov. 1991.*

* cited by examiner

*Primary Examiner* — Tan X Dinh
(74) *Attorney, Agent, or Firm* — Posz Law Group, PLC

(57) ABSTRACT

An estimation method includes a heating step in which a recording bit, on which a reference signal is recorded, is heated under each of heating conditions having different heating temperatures, the recording bit being at least one recording bit in the magnetic recording medium, and a measurement step in which a signal intensity with respect to the reference signal recorded in the recording bit after heating is measured under each of the heating conditions of the heating step. Based on the signal intensities with respect to the reference signal respectively measured in the measurement step, the distribution width of the Curie temperatures of the plurality of magnetic grains that form the magnetic recording layer is estimated.

9 Claims, 11 Drawing Sheets

ESTIMATION METHOD OF CURIE TEMPERATURE DISTRIBUTION WIDTH

BACKGROUND OF THE INVENTION

1. Field of the Invention

The present invention relates to a method for estimating a distribution width of Curie temperatures of a plurality of magnetic grains that form a magnetic recording layer of a magnetic recording medium used in thermally-assisted magnetic recording.

2. Description of the Related Art

In the field of magnetic recording using a head and a medium, further improvement is demanded in the performance of a thin film magnetic head and a magnetic recording medium in conjunction with a growth of the high recording density of a magnetic disk device. As the thin film magnetic head, currently, a composite-type thin film magnetic head is widely used having a structure in which a magnetoresistive (MR) element for reading and an electromagnetic transducer element for writing are laminated.

The magnetic recording medium is a discontinuous medium in which magnetic grains that are formed from a magnetic material are aggregated, and each of the magnetic grains forms a single magnetic domain structure. In this magnetic recording medium, one recording bit is composed of a plurality of magnetic grains. Therefore, in order to increase the recording density, the volume of a magnetic grain should be reduced to reduce asperity of a boundary between adjacent recording bits. However, when the magnetic grains are made small, a problem occurs that along with the decrease of the volume of a magnetic grain, thermal stability of the magnetization of the magnetic grain decreases.

As a countermeasure to this problem, it is conceivable to increase magnetic anisotropy energy Ku of a magnetic grain. However, the increase in Ku results in an increase in an anisotropy magnetic field (coercive force) of the magnetic recording medium. On the other hand, an upper limit of a writing magnetic field intensity of a thin film magnetic head is largely determined by a saturation magnetic flux density of a soft magnetic material that composes a magnetic core in the head. Therefore, when the anisotropy magnetic field of the magnetic recording medium exceeds a tolerance value determined from the upper limit of the writing magnetic field intensity, writing becomes impossible. Currently, as a method for solving such a thermal stability problem, a so-called thermally-assisted magnetic recording system has been proposed in which, while a magnetic recording medium formed from a magnetic material with a large Ku is used, the anisotropy magnetic field is reduced to perform writing by heating the magnetic recording medium to a temperature near the Curie temperatures of the magnetic grains immediately before a writing magnetic field is applied.

A magnetic recording medium (magnetic disk) 301 used in the thermally-assisted magnetic recording has a configuration in which, for example, as illustrated in FIG. 1, a soft magnetic under layer 301b, a heat sink layer 301c, an intermediate layer 301d, a magnetic recording layer 301e and a protective layer 301f are laminated in this order on a disk substrate 301a. The magnetic recording layer 301e is fabricated on the intermediate layer 301d by using a film formation method such as sputtering, and is formed as an aggregate of a plurality of magnetic grains that are composed of a magnetic material such as a single metallic material and an alloy material composed of two or more kinds of metals.

In such a magnetic recording medium 301, variations may occur in the size and shape of the plurality of magnetic grains that form the magnetic recording layer 301e due to film formation conditions and the like. Further, in the case where the magnetic grains are composed of an alloy material that is composed of two or more kinds of metals, the metal composition of the alloy material may be non-uniform with respect to each of the magnetic grains. As a result of these, the Curie temperature of each magnetic grain (the temperature at which the magnetization of the magnetic grain disappears) is different and a distribution of a predetermined width occurs in the Curie temperature.

The distribution width of the Curie temperatures of the magnetic grains (the difference between the maximum value (maximum Curie temperature) and the minimum value (minimum Curie temperature) among the Curie temperatures of the plurality of magnetic grains) that may occur in this manner affects characteristics of a thermally-assisted magnetic recording device.

For example, in a case where the thermally-assisted magnetic recording device includes a magnetic head that can heat a magnetic recording medium on an upstream side in a medium traveling direction of the magnetic recording medium and apply a recording magnetic field to the magnetic recording medium on a downstream side in the medium traveling direction of the magnetic recording medium, the magnetization transition point of each of the magnetic grains that form the magnetic recording layer of the magnetic recording medium in magnetic recording using the magnetic head should be considered.

In this case, for magnetic grains having Curie temperatures in a low temperature region (near the minimum Curie temperature), the magnetization transition point is located on a relatively downstream side in the medium traveling direction. On the other hand, for magnetic grains having Curie temperatures in a high temperature region (near the maximum Curie temperature), the magnetization transition point is located on a relatively upstream side in the medium traveling direction. Therefore, according to the distribution width of the Curie temperatures of the magnetic grains, the width of the magnetization transition points of the magnetic grains in the magnetic recording medium changes. Therefore, the larger the distribution width of the Curie temperatures of the plurality of magnetic grains that form the magnetic recording layer of the magnetic recording medium provided in the thermally-assisted magnetic recording device is, the easier the jitter associated with unintended magnetization reversal and the like occurs, and the SN ratio and bit error rate (BER) tend to deteriorate.

To meet the demand for even higher recording density in a thermally-assisted magnetic recording device, it is important not only to improve recording characterizations of the magnetic head but also to reduce recording errors of the magnetic grains that form the magnetic recording layer of the magnetic recording medium. Therefore, with respect to the magnetic recording medium with which the thermally-assisted magnetic recording device is configured, performing pass/fail determination based on the distribution width of the Curie temperatures of the plurality of magnetic grains that form the magnetic recording layer and, for this purpose, reliably obtaining the distribution width of the Curie temperatures of the magnetic grains are important for solving the above problems.

As a method for measuring the Curie temperature of the magnetic recording layer in the magnetic recording medium, in general, a method involving hysteresis loop measurement at a high temperature is known. However, in this method, only an average value of the Curie temperatures of the plurality of magnetic grains that form the magnetic recording layer (the temperature at which magnetization disappears in a majority of the magnetic grains among the plurality of magnetic grains) is obtained. The distribution width of the Curie temperatures that arises due to the difference in the Curie temperature for each magnetic grain cannot be measured.

SUMMARY OF THE INVENTION

An object of the present invention is provide a method for reliably estimating a distribution width of a Curie temperature of a plurality of magnetic grains that form a magnetic recording layer of a magnetic recording medium used in thermally-assisted magnetic recording.

In order to achieve the objection, the present invention provides an estimation method for estimating a distribution width of Curie temperatures of a plurality of magnetic grains that form a magnetic recording layer of a magnetic recording medium used in thermally-assisted magnetic recording, the method including: a heating step in which a recording bit, on which a reference signal is recorded, is heated under each of a plurality of heating conditions having different heating temperatures, the recording bit being at least one recording bit in the magnetic recording medium; and a measurement step in which a signal intensity with respect to the reference signal recorded in the recording bit after heating is measured under each of the heating conditions of the heating step. Wherein based on the signal intensities with respect to the reference signal respectively measured in the measurement step, the distribution width of the Curie temperatures of the plurality of magnetic grains that form the magnetic recording layer is estimated (First Invention).

In the above invention (First Invention), it is preferred that based on the signal intensities with respect to the reference signal measured in the measurement step, a difference between a maximum Curie temperature and a minimum Curie temperature of a plurality of magnetic grains contained in the recording bits is calculated, and based on the difference, the distribution width of the Curie temperatures of the plurality of magnetic grains that form the magnetic recording layer is estimated (Second Invention).

In the above invention (First Invention), it is preferred that in the heating step, heating is performed such that a temperature at a substantial center point of the recording bit in a track width direction becomes the same as the heating temperature in each of the heating conditions, and based on the signal intensities with respect to the reference signal at the substantial center point of the recording bit, the distribution width of the Curie temperatures of the plurality of magnetic grains that form the magnetic recording layer is estimated (Third Invention).

In the above invention (First Invention), it is preferred that the recording bit is recording bits at a plurality of locations in the magnetic recording medium, based on the signal intensities with respect to the respective reference signals of the recording bits at the plurality of locations, differences between a maximum Curie temperature and a minimum Curie temperature of a plurality of magnetic grains respectively contained in the recording bits at the plurality of locations is calculated, and based on the differences respectively calculated at the recording bits at the plurality of locations, the distribution width of the Curie temperatures of the plurality of magnetic grains that form the magnetic recording layer is estimated (Fourth Invention).

In the above invention (First Invention), it is preferred that in the heating step, a thermally-assisted magnetic recording head is used, which includes: a magnetic pole generating a recording magnetic field from an end surface that forms a portion of an air bearing surface opposing the magnetic recording medium; a waveguide through which light for exciting a surface plasmon propagates; and a plasmon generator generating, by coupling with the light in a surface plasmon mode, near-field light from a near-field light generating end surface that forms a portion of the air bearing surface, the recording bit on which the reference signal is recorded is heated by irradiating the recording bit with the near-field light generated by the plasmon generator without applying the recording magnetic field from the magnetic pole to the magnetic recording medium (Fifth Invention).

In the above invention (Fifth Invention), it is preferred that the thermally-assisted magnetic recording head further includes a laser diode irradiating the waveguide with light propagating through the waveguide, and in the heating step, the heating temperature of each of the heating conditions is set by setting a operating current applied to the laser diode (Sixth Invention).

In the above invention (First Invention), it is preferred that in each of the heating step, a track on which a reference signal is recorded is heated under each of a plurality of heating conditions having different heating temperatures, the track being at least one track in the magnetic recording medium, and in the measurement step, a signal intensity with respect to the reference signal in the track after heating is measured under each of the heating conditions of the heating step (Seventh Invention).

Also, the present invention provides an estimation method of a Curie temperature distribution width for estimating a distribution width of Curie temperatures of a plurality of magnetic grains that form a magnetic recording layer of a magnetic recording medium used in thermally-assisted magnetic recording, the method including: a heating step in which each of a plurality of recording bits, on which a reference signal is recorded, is heated, the recording bits being in the magnetic recording medium, and; a measurement step in which a signal intensity with respect to the reference signal in each of the recording bits after heating is measured. Wherein in the heating step, each of the recording bits is heated under one of heating condition having a different heating temperature, and based on the signal intensities with respect to the reference signal in each of the recording bits measured in the measurement step, the distribution width of the Curie temperatures of the plurality of magnetic grains that form the magnetic recording layer is estimated (Eighth Invention).

In the above invention (Eighth Invention), it is preferred that in the heating step, each of tracks is heated under one of heating conditions having a different heating temperature, the tracks being in the magnetic recording medium and on each of which a reference signal is recorded; in the measurement step, the signal intensities with respect to the reference signal in each of the tracks after heating is measured, and based on the signal intensities with respect to the reference signal in each of the tracks measured in the measurement step, the distribution width of the Curie temperatures of the plurality of magnetic grains that form the magnetic recording layer is estimated (Ninth Invention).

According to the present invention, it is possible to provide a method for reliably estimating a distribution width of a Curie temperature of a plurality of magnetic grains that form a magnetic recording layer of a magnetic recording medium used in thermally-assisted magnetic recording.

DESCRIPTION OF THE PREFERRED EMBODIMENTS

Before explaining the embodiment of the present invention, terms used in the present specification are defined. In a lamination structure or an element structure that is formed on an element formation surface of a slider substrate of a magnetic head in the embodiment of the present invention, as viewed from a reference layer or an element, a substrate side is a "downward" side and the opposite side thereof is an "upward" side. Further, in a magnetic head in the embodiment of the present invention, as needed, "X, Y and Z axis directions" are defined in some drawings. Here, a Z-axis direction is the "up-down direction" described above; a +Z side corresponds to a trailing side (downstream side in the medium traveling direction) and a −Z side corresponds to a leading side (upstream side in the medium traveling direction). Further, a Y-axis direction is a track width direction and an X-axis direction is a height direction.

An embodiment of the present invention is explained with reference to the drawings.

(Configuration of Magnetic Recording Medium (Magnetic Disk))

First, a schematic configuration of a magnetic recording medium (magnetic disk), of which a Curie temperature distribution width is to be estimated in the present embodiment, is explained.

Figure 1:
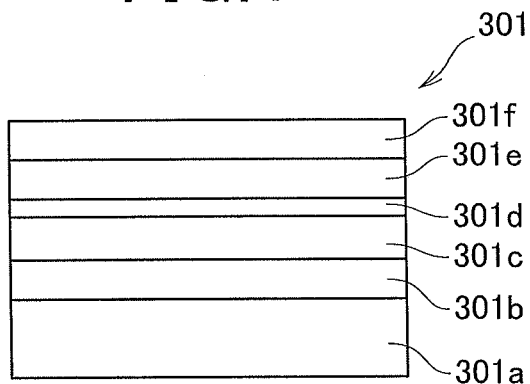
FIG. 1 is a partial cross-sectional view illustrating an example of a configuration of a magnetic recording medium (magnetic disk) for which estimation is to be performed in an estimation method of a Curie temperature distribution width according to an embodiment of the present invention.

As a magnetic disk 301 in the present embodiment, its configuration is not particularly limited as long as it is a magnetic disk that is used in thermally-assisted magnetic recording. However, for example, the magnetic disk 301 has a configuration in which, for example, as illustrated in FIG. 1, a soft magnetic under layer 301$b$ of a CoFe alloy and the like, a heat sink layer 301$c$ of Cr, Ti, Ta, Cu, Ag, Au (preferably Cu, Ag, Au) and the like, an intermediate layer 301$d$, a magnetic recording layer (perpendicular magnetization layer) 301$e$ containing a predetermined magnetic material, and a protective layer 301$f$ are laminated in this order on at least one surface of a disk substrate 301$a$, and a lubricating film (not illustrated in the drawings) of perfluoropolyether, fluorinated alcohol, fluorinated carboxylic acid, and the like is applied to the uppermost layer, the disk substrate 301$a$ being a metallic substrate formed of a metallic material such as aluminum and aluminum alloy, a nonmetallic substrate formed of a nonmetallic material such as glass, ceramic, silicon, silicon carbide and carbon, or the like.

The magnetic recording layer 301$e$ in the magnetic disk 301 is formed by aggregating a plurality of magnetic grains that are formed from a predetermined magnetic material, and each of the magnetic grains forms a single magnetic domain structure. Examples of the constituent material of the magnetic recording layer 301$e$ include, for example, NiFe, CoFe, FePt—C, FePt—$SiO_2$, CoCrPt, and the like.

The magnetic recording layer 301$e$ is formed, in general, by laminating the magnetic material using a film formation method such as a sputtering method. However, for example, due to film formation condition and the like, the size and shape of the magnetic grains that form the magnetic recording layer 301$e$ may be non-uniform in the magnetic recording layer 301$e$. Further, in a case where the magnetic material is an alloy material, the metal composition of the alloy material that forms each of the magnetic grains may be non-uniform by each of the magnetic grains. In such a case, distribution may occur in the Curie temperatures (disappearance temperatures of magnetic moments (magnetizations)) of the plurality of magnetic grains that form the magnetic recording layer 301e.

Performing thermally-assisted magnetic recording using the magnetic disk 301 containing the magnetic recording layer 301e formed by the plurality of magnetic grains having a distribution in their Curie temperatures as described above is considered. In this case, among the plurality of magnetic grains that form one recording bit in the magnetic disk 301, when magnetic grains having Curie temperatures near the minimum Curie temperature (the minimum value of the Curie temperatures of the plurality of magnetic grains) is compared with magnetic grains having Curie temperatures near the maximum Curie temperature (the maximum value of the Curie temperatures of the plurality of magnetic grains), although it also depends on the configuration and the like of the magnetic head performing the thermally-assisted magnetic recording, for the magnetic grains having Curie temperatures near the minimum Curie temperature, magnetization reversal occurs on a relatively downstream (or upstream) side in the medium traveling direction, and the magnetization transition point is located on the relatively downstream (or upstream) side in the medium traveling direction. On the other hand, for the magnetic grains having Curie temperatures near the maximum Curie temperature, magnetization reversal occurs on a relatively upstream (or downstream) side in the medium traveling direction, and the magnetization transition point is located on the relatively upstream (or downstream) side in the medium traveling direction.

Figure 2:
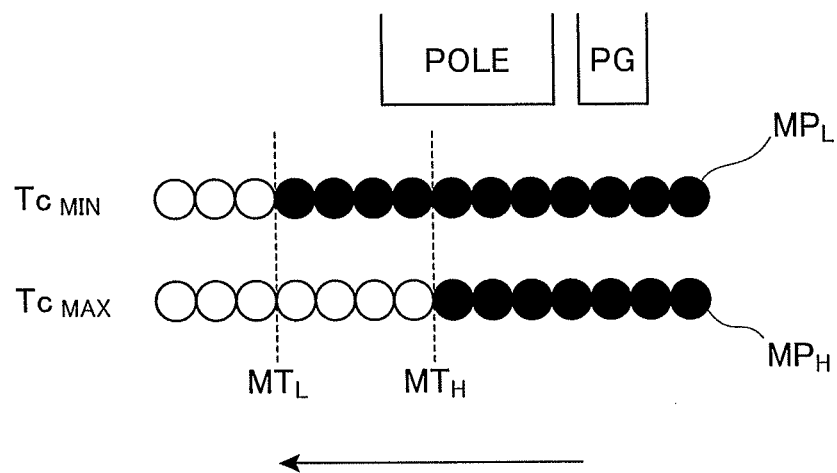
FIG. 2 conceptually illustrates a state of magnetization reversal of magnetic grains when a recording magnetic field is applied to a magnetic disk in a case where a thermally-assisted magnetic head is provided with a configuration that allows the magnetic disk to be heated on an upstream side (leading side) in a medium traveling direction and the recording magnetic field to be applied on a downstream side (trailing side) in the medium traveling direction.

In a case where the thermally-assisted magnetic head has a configuration that allows the magnetic disk 301 to be heated on the upstream side (leading side) in the medium traveling direction and a recording magnetic field to be applied on the downstream side (trailing side) in the medium traveling direction, a state of the magnetization reversal of the magnetic grains when the recording magnetic field is applied to the magnetic disk 301 is conceptually illustrated in FIG. 2. In FIG. 2, white circles represent magnetic grains in which magnetization reversal has not occurred and black circles represent magnetic grains in which magnetization reversal has occurred.

As illustrated in FIG. 2, a magnetic grain $MP_L$ having a Curie temperature near the minimum Curie temperature is heated by a heat source PG. When a recording magnetic field is applied by a magnetic pole POLE during movement relatively in the medium traveling direction (an arrow direction illustrated in FIG. 2), a magnetic grain $MP_L$ located on a relatively downstream side in the medium traveling direction is also in a state in which an anisotropy magnetic field (coercive force) is reduced to a writable extent. Therefore, magnetization reversal occurs also at this location. Therefore, for this magnetic grain $MP_L$, a magnetization transition point $MT_L$ is located on the relatively downstream side in the medium traveling direction. On the other hand, for a magnetic grain $MP_H$ having a Curie temperature near the maximum Curie temperature, a magnetic grain $MP_H$ located on a relatively upstream side in the medium traveling direction is in the state in which the anisotropy magnetic field (coercive force) is reduced to a writable extent. However, a magnetic grain $MP_H$ located on a relatively downstream side in the medium traveling direction is not in the state in which the anisotropy magnetic field (coercive force) is reduced to a writable extent. Therefore, for this magnetic grain $MP_H$, the magnetization reversal occurs on the relatively upstream side in the medium traveling direction, and thus a magnetization transition point $MT_H$ is located on the upstream side in the medium traveling direction.

As described above, the magnetic grains contained in the magnetic recording layer 301e have a distribution in their Curie temperatures. Therefore, according to the distribution width of the Curie temperatures, the width of the magnetization transition points of the magnetic grains during the thermally-assisted magnetic recording changes. This means that the larger the distribution width of the Curie temperatures of the magnetic grains that form the magnetic recording layer 301e of the magnetic disk 301 is, the easier jitter associated with unintended magnetization reversal and the like occurs. Therefore, the distribution width of the Curie temperatures affects recording characterization in the thermally-assisted magnetic recording. Therefore, by estimating the distribution width of the Curie temperatures of the plurality of magnetic grains that form the magnetic recording layer 301e using the estimation method of the Curie temperature distribution width in the present embodiment, pass/fail determination of the magnetic disk can be performed based on the distribution width and from the point of view of characterizations such as a high SN ratio and a low BER.

(Estimation Method of Curie Temperature Distribution Width)

Next, the estimation method of the Curie temperature distribution width in the present embodiment is explained.

Figure 3A:
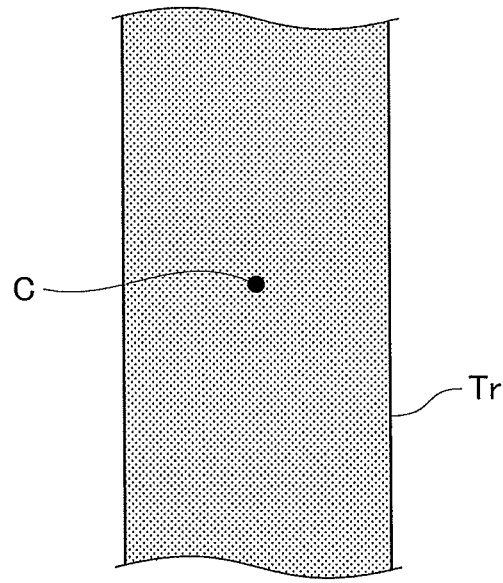
FIGS. 3A-3B are plan views schematically illustrating steps of the estimation method of the Curie temperature distribution according to the embodiment of the present invention.

First, a magnetic recording medium (magnetic disk) of which the Curie temperature distribution width is to be estimated is prepared, and, by using a thermally-assisted magnetic head having a configuration that will be described later, a reference signal at a predetermined frequency is recorded on at least one arbitrarily selected track Tr of the magnetic disk (for example, a track Tr located substantially in the middle in a radial direction of the magnetic disk) (recording step; see FIG. 3A). The signal intensity with respect to the recorded reference signal is measured beforehand using the thermally-assisted magnetic head. The signal intensity with respect to the reference signal measured at this time will be used as the signal intensity with respect to the reference signal before heating in a step to create a graph for estimating the Curie temperature distribution width that will be described later (see FIGS. 4A and 4B).

Figure 3B:
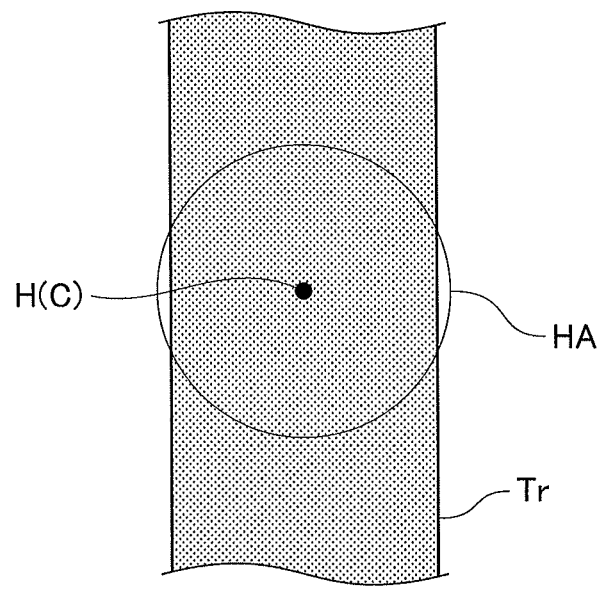

Next, the track Tr on which the reference signal is recorded in the above-described recording step is heated under a predetermined heating condition (heating step; see FIG. 3B). The heating condition in the heating step can be configured so that, for example, a plurality of magnetic grains contained in the one track Tr are heated to a temperature near the minimum Curie temperature of the Curie temperature distribution width of the magnetic grains. Specifically, the heating condition can be set so that the signal intensity with respect to the reference signal recorded on the track Tr is slightly reduced after heating (for example, the signal intensity with respect to the reference signal after heating is about 97% of the signal intensity with respect to the reference signal before heating).

For each magnetic disk of which the Curie temperature distribution width is to be estimated, the Curie temperature distribution width of the magnetic grains may be different. Therefore, it may be difficult to predict a temperature near the minimum Curie temperature of the plurality of magnetic grains in the magnetic disk for which the estimation is to be performed. However, for example, the heating condition (heating temperature) can be obtained as follows.

It is believed that the distribution of the Curie temperatures of the plurality of magnetic grains that form the magnetic recording layer 301e is described by a Gaussian distribution.

Therefore, it is believed that the Curie temperature of the magnetic disk 301 (magnetic recording layer 301e) obtained by hysteresis loop measurement and the like at a high temperature is substantially equal to the temperature (the average Curie temperature $Tc_{AVE}$) at which magnetization disappears in a majority of the magnetic grains among the plurality of magnetic grains that form the magnetic recording layer 301e. Therefore, based on the Curie temperature obtained by the hysteresis loop measurement and the like, and in accordance with the layer configuration of the magnetic disk 301, and the kind of the magnetic material of which the magnetic recording layer 301e is composed, and the like, an appropriate heating condition is set. This allows the plurality of magnetic grains contained in the track Tr to be heated to an extent that the signal intensity with respect to the reference signal is slightly reduced (for example, the signal intensity with respect to the reference signal after heating is about 97% of the signal intensity with respect to the reference signal before heating).

As a method of heating the track Tr on which the reference signal is recorded, for example, a method of irradiating the track Tr with near-field light emitted from a plasmon generator using a thermally-assisted magnetic head having a configuration that will be described later can be used.

In the heating step, the track Tr is heated such that the center of the heated region (near-field light spot) HA on the magnetic disk 301 substantially coincides with a center point C in the track width direction of the track Tr on which the reference signal is recorded (see FIG. 3B). As will be described later, in the present embodiment, the heating step is performed multiple times under different heating conditions (heating temperatures), and the Curie temperature distribution width is estimated based on the signal intensities with respect to the reference signal at the center point C in the track width direction of the track Tr. Therefore, when the center of the heated region (near-field light spot) HA deviates from the center point C in the track width direction in the track Tr toward either side in the track width direction, it may be difficult to reliably estimate the Curie temperature distribution width.

When the track Tr is heated by irradiating the track Tr with the near-field light emitted from the plasmon generator using the thermally-assisted magnetic head, a recording magnetic field is not to be applied to the magnetic disk 301 (track Tr). When a recording magnetic field is applied to the track Tr on which the reference signal is recorded, even when the track Tr is only heated to a temperature below the Curie temperatures of the magnetic grains contained in the track Tr, the recording magnetic field affects the magnetic moment (magnetization) of each of the magnetic grains so that the Curie temperature distribution width of the magnetic grains cannot be accurately obtained. Depending on the thermally-assisted magnetic head, a small magnetic field (a magnetic field with such an intensity that does not affect the orientation of the easy magnetization axis (magnetic moment) (direction of the magnetization) of the magnetic grains that form the recording layer of the magnetic disk) may be always generated from the magnetic pole. However, the magnetic field with such weak intensity may be applied to the track Tr during heating in the heating step. Even when the magnetic field with such weak intensity is applied to the track Tr, it does not affect the estimation of the Curie temperature distribution width of the magnetic grains in the present embodiment.

Next, the reference signal recorded in the track Tr, which is heated in the heating step, is reproduced using the thermally-assisted magnetic head, and a reproduction signal intensity with respect to the reference signal is measured (measurement step). In the above-described heating step, by heating the track Tr, magnetic moment (magnetization) disappears in the magnetic grains having Curie temperatures near the minimum Curie temperature among the plurality of magnetic grains contained in the track Tr, and accordingly the signal intensity with respect to the reference signal is reduced.

After the above-described measurement step, the heating step is performed while the heating condition is changed (the heating temperature is gradually increased, for example, in a range of 15-35 K), and after heating under each of heating conditions (each of heating temperature), the measurement step is performed. A step that includes one heating step and one measurement step is repeated until the reproduction signal intensity with respect to the reference signal becomes substantially zero. In the present embodiment, that "the reproduction signal intensity with respect to the reference signal becomes substantially zero" means that the signal intensity with respect to the reference signal has attenuated to an extent that the reference signal cannot be read using the magnetic head. Specifically, for example, it means that the attenuation rate from the reproduction signal intensity with respect to the reference signal before heating becomes 97% or more and preferably 100%.

Next, a graph illustrating a relationship between the heating condition (heating temperature HT) in each of heating steps and the measured value of the reproduction signal intensity with respect to the reference signal is created, and from the graph, the heating temperature at which the signal intensity with respect to the reference signal begins to decrease and the heating temperature at which the signal intensity with respect to the reference signal becomes substantially zero are obtained.

Figure 4A:
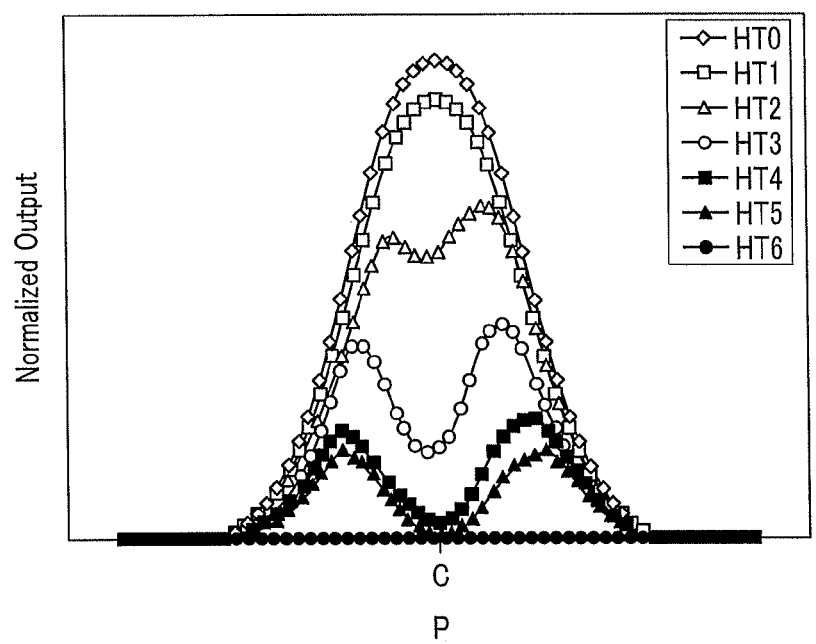
FIG. 4A is a graph that is created in the estimation method of the Curie temperature distribution according to the embodiment of the present invention and that illustrates an example of a relationship between the signal intensity with respect to a reference signal and the location of a recording bit in a track width direction.

Specifically, as illustrated in FIG. 4A, a graph (horizontal axis (X axis): a location P in the track width direction (cross track direction); vertical axis: a normalized signal intensity with respect to the reference signal) is created that illustrates a relationship between the signal intensity with respect to the reference signal (normalized signal intensity) under each heating condition (HT0 before heating and each heating temperature HT (HT1-HT6 in FIG. 4A)) and the location P in the track width direction of the heated track Tr. Based on the signal intensities with respect to the reference signal at the center point C in the track width direction of the track Tr plotted in this graph (see FIG. 4A), as illustrated in FIG. 4B, a graph is created in which the horizontal axis (X axis) is the heating temperature HT and the vertical axis (Y axis) is the signal intensity (normalized signal intensity) of the reference signal.

Figure 4B:
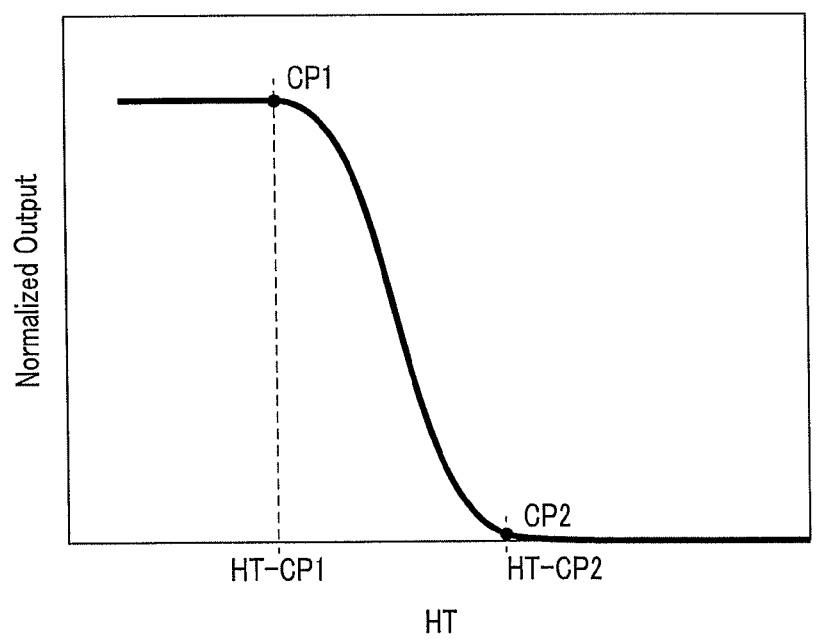
FIG. 4B is a graph that is created in the estimation method of the Curie temperature distribution according to the embodiment of the present invention and that illustrates an example of a relationship between the signal intensity with respect to the reference signal and a heating temperature.

In the graph illustrated in FIG. 4B, at heating temperatures lower than the minimum Curie temperature, the signal intensity with respect to the reference signal does not attenuate. Therefore, when viewed from the low temperature side of the heating temperature, the graph illustrates a straight line parallel to the horizontal axis (X axis) until a predetermined heating temperature. When the heating temperature reaches the predetermined temperature, the signal intensity with respect to the reference signal slightly attenuates and the graph changes from a straight line to a curved line toward the high temperature side. A heating temperature HT-CP1 at a point (first changing point) CP1 at which the graph changes from a straight line to a curved line is the heating temperature at which the signal intensity with respect to the reference signal begins to decrease. It is considered that the signal intensity with respect to the reference signal in the heated track Tr begins to decrease as that, due to the heating at the time, the magnetization of the magnetic grains of the minimum Curie temperature ($Tc_{MIN}$) among the plurality of magnetic grains contained in the track Tr has disappeared. Therefore, the heating temperature HT-CP1 at the first changing point CP1 (the heating temperature at which the signal intensity with respect to the reference signal begins to decrease) can be estimated as the minimum Curie temperature ($Tc_{MIN}$) of the plurality of magnetic grains contained in the track Tr.

Next, as the created graph (see FIG. 4B) on the high temperature side is further looked, when the heating temperature reaches a predetermined temperature, the signal intensity with respect to the reference signal becomes zero, and the graph changes from a curved line to a straight line toward the high temperature side. A heating temperature HT-CP2 at a point (second changing point) CP2 at which the graph changes from the curved line to the straight line is the heating temperature at which the signal intensity with respect to the reference signal becomes substantially zero. That the signal intensity with respect to the reference signal in the heated track Tr becomes substantially zero is considered as that, due to the heating at the time, the magnetization of the magnetic grains of the maximum Curie temperature ($Tc_{MAX}$) among the plurality of magnetic grains contained in the track Tr has disappeared. Therefore, the heating temperature HT-CP2 at the second changing point CP2 (the heating temperature at which the signal intensity with respect to the reference signal becomes substantially zero) can be estimated as the maximum Curie temperature ($Tc_{MAX}$) of the plurality of magnetic grains contained in the track Tr.

The difference ($Tc_{MAX}-Tc_{MIN}$) between the maximum Curie temperature ($Tc_{MAX}$) and the minimum Curie temperature ($Tc_{MIN}$) that are obtained as described above can be considered as the distribution width ΔTc-Tr of the Curie temperatures of the plurality of magnetic grains contained in the track Tr on which the reference signal is recorded.

In the plurality of magnetic grains that form the magnetic recording layer 301e of the magnetic disk 301, as described above, there may be variations in the size and shape of the particles due to film formation condition and the like, and, in the case where the magnetic grains are composed of an alloy material that is composed of two or more kinds of metals, the metal composition of the alloy material may be non-uniform with respect to each of the magnetic grains. However, with respect to the entire surface of the magnetic disk 301, the size and shape of the magnetic grains and the distribution of the metal composition of the alloy material can be considered as substantially the same. Based on such an idea, it can be estimated that the distribution width ΔTc-Tr of the Curie temperatures of the plurality of magnetic grains contained in the one track Tr, obtained as described above, substantially equals the distribution width ΔTc of Curie temperatures of all magnetic grains contained in the magnetic recording layer 301e of the magnetic disk 301. Therefore, by obtaining the distribution width ΔTc-Tr of the Curie temperatures of the plurality of magnetic grains contained in an arbitrarily selected one track Tr among the plurality of magnetic grains that form the magnetic recording layer 301e of the magnetic disk 301, the distribution width ΔTc of the Curie temperatures of the plurality of magnetic grains contained in the magnetic recording layer 301e of the magnetic disk 301 can be estimated.

In the present embodiment, it is also possible to record a reference signal on each of a plurality of arbitrarily selected tracks Tr, obtain a Curie temperature distribution width ΔTc-Tr of the plurality of magnetic grains contained in each of the tracks Tr as described above, and, from the obtained Curie temperature distribution widths ΔTc-Tr, estimate the distribution width ΔTc of the Curie temperatures of the plurality of magnetic grains that form the magnetic recording layer 301e of the magnetic disk 301. For example, for each of a track near the innermost circumference, a track near the outermost circumference, and a track located in about the middle of the tracks near the innermost and outermost circumferences, of the magnetic recording layer 301e of the magnetic disk 301, a distribution width ΔTc-Tr of the Curie temperatures of a plurality of magnetic grains contained in the track is obtained, and based on an arithmetic mean value and a standard deviation of the obtained results, the distribution width ΔTc of the Curie temperatures of the plurality of magnetic grains contained in the magnetic recording layer 301e of the magnetic disk 301 can be obtained. This allows the distribution width ΔTc of the Curie temperatures of the plurality of magnetic grains contained in the magnetic recording layer 301e of the magnetic disk 301 to be more accurately estimated.

In the heating steps of the present embodiment, the track Tr is heated by irradiating the track Tr with near-field light emitted from the plasmon generator of the thermally-assisted magnetic head. However, since the heated region HA is extremely small and the heating time is extremely short, directly measuring the temperature of the magnetic grains in the track Tr is difficult. On the other hand, as will be described later, in the thermally-assisted magnetic head used in the heating steps of the present embodiment, laser light radiated from a laser diode on a rear end surface of a waveguide propagates through the plasmon generator in a surface plasmon mode while propagating through the waveguide, and the magnetic disk 301 (track Tr) is heated by irradiating the magnetic disk with near-field light from a near-field light generating end surface located on an air bearing surface (ABS). The laser diode as a light source oscillates laser light when a predetermined operating current is applied. Therefore, in the present embodiment, when the track Tr is heated, it is necessary to obtain a correlation between values of the operating current of the laser diode and the temperature of the magnetic grains in the track Tr.

Specifically, after a DC magnetization treatment (magnetization treatment to orient magnetization directions of all magnetic grains that form the magnetic recording layer 301e of the magnetic disk 301 to the same direction) is performed to the magnetic disk 301 using the thermally-assisted magnetic head, a recording magnetic field of a predetermined magnetic field intensity (MFs) is applied by the magnetic pole of the magnetic head in a direction opposite to the magnetization direction due to the DC magnetization treatment in the magnetic disk 301, and in addition, near-field light is applied to the magnetic disk 301 by the plasmon generator by applying a predetermined operating current (Iop) to the laser diode. Then, by reproducing the signal using the magnetic head, noise is measured.

Figure 5:
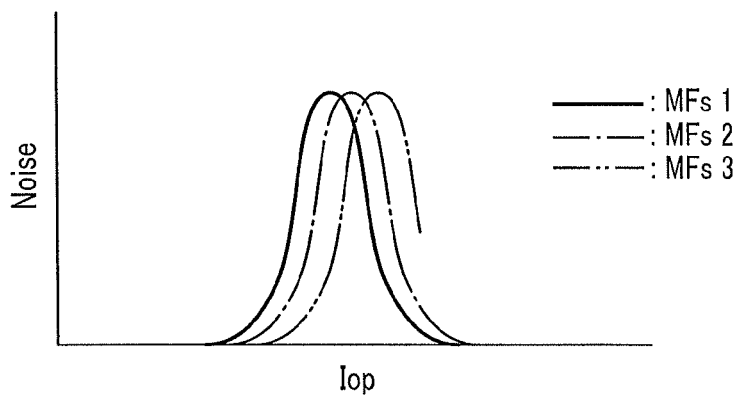
FIG. 5 is a graph that is created in order to obtain a correlation between a operating current (Iop) applied to a laser diode and the temperature in the magnetic recording layer of the magnetic disk in the embodiment of the present invention and that illustrates a relationship between the operating current (Iop) and a noise peak value.

The above-described noise measurement is performed while the magnetic field intensity (MFs) of the recording magnetic field applied to the magnetic disk 301 is kept constant and the operating current (Iop) applied to the laser diode is changed, and a graph is created illustrating a relationship between the noise value and the operating current (Iop) (see FIG. 5). As a result, the operating current (Iop) corresponding to a noise peak value can be obtained from the graph.

Figure 6:
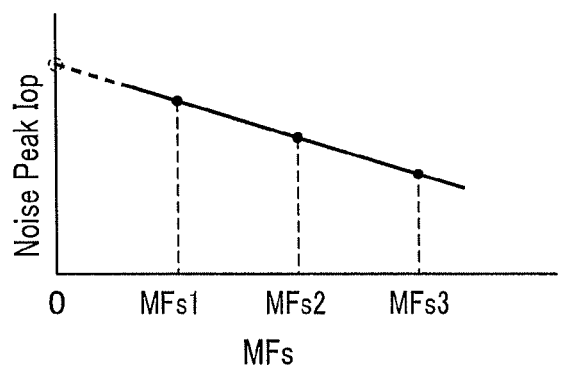
FIG. 6 is a graph that is created in order to obtain a correlation between the operating current (Iop) applied to the laser diode and the temperature in the magnetic recording layer of the magnetic disk in the embodiment of the present invention and that illustrates a relationship between the intensity of a recording magnetic field applied from a magnetic pole and the operating current (Iop) corresponding to the noise peak value.

By such noise measurement, while the magnetic field intensity (MFs) of the recording magnetic field applied to the magnetic disk is changed (in the example illustrated in FIG. 5, MFs1-MFs3), the operating current (Iop) corresponding to a noise peak value is obtained for each magnetic field intensity (MFs) (see FIG. 5), and a correlation between the operating current (Iop) corresponding to the noise peak value and the recording magnetic field intensity is obtained (see FIG. 6). Then, from the graph that illustrates this correlation (see FIG.

6), the operating current (Iop) corresponding to the noise peak value when the recording magnetic field intensity is zero is obtained.

It can be said that the temperature of the magnetic grains at the center point C in the track width direction of the track Tr when the near-field light is radiated by an application of the operating current (Iop) obtained as described above to the laser diode is the temperature at which the magnetization of a majority of the plurality of magnetic grains disappears due to only heat without an application of a magnetic field to the magnetic disk. Here, the Curie temperatures of the magnetic grains that form the magnetic recording layer 301e of the magnetic disk 301 distribute with a predetermined width. However, it is believed that such distribution of the Curie temperatures is described by a Gaussian distribution. Therefore, the above-described temperature at which the magnetization of a majority of the plurality of magnetic grains disappears can be defined as the Curie temperature that accounts for the largest number of the distribution, that is, the average Curie temperature ($Tc_{AVE}$) of the magnetic grains that form the magnetic recording layer 301e of the magnetic disk 301. The average Curie temperature ($Tc_{AVE}$) of the magnetic grains that form the magnetic recording layer 301e of the magnetic disk 301 can be obtained in advance by hysteresis loop measurement at a high temperature and the like as described above.

After the relationship between the operating current (Iop) applied to the laser diode and the average Curie temperature ($Tc_{AVE}$) of the magnetic grains that form the magnetic recording layer of the magnetic disk is obtained as described above, a relationship between the operating current (Iop) applied to the laser diode and the temperature of the magnetic grains in the track Tr is obtained.

Figure 7:
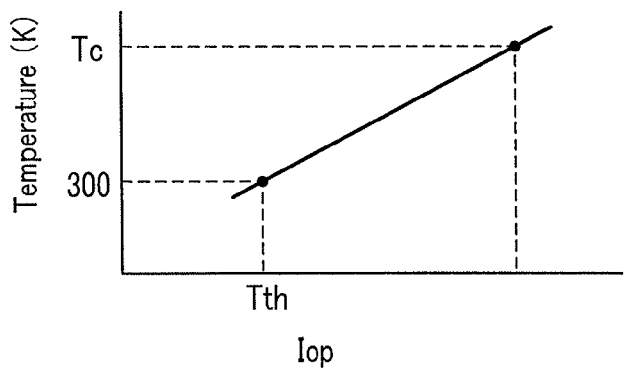
FIG. 7 is a graph illustrating a correlation between the operating current (Iop) applied to the laser diode and the temperature in the magnetic recording layer of the magnetic disk in the embodiment of the present invention.

When an oscillation start current (Ith) of the laser diode is applied to the laser diode, since the light intensity of the near-field light emitted from the plasmon generator is substantially zero (light intensity of the extent that the recording layer of the magnetic disk is not heated), it can be said that the temperature of the magnetic grains in the track Tr is at normal temperature (300 K). The operating current (Iop) applied to the laser diode and the light intensity of the near-field light emitted from the plasmon generator are in a proportional relationship. Therefore, it can be said that the operating current (Iop) and the temperature of the magnetic grains in the track Tr are in a substantially proportional relationship. Therefore, the correlation between the operating current (Iop) applied to the laser diode and the temperature of the magnetic grains in the track Tr can be obtained as the graph illustrated in FIG. 7. Based on this correlation, the temperature of the magnetic grains in the track Tr can be obtained from the operating current (Iop) applied to the laser diode.

Therefore, in the heating steps of the present embodiment, based on the correlation obtained as described above between the temperature of the magnetic grains in the track Tr and the operating current (Iop) applied to the laser diode, a operating current (Iop) that allows the temperature of the magnetic grains in the track Tr to become a predetermined temperature is applied to the laser diode, and the recording bit Rb is heated by irradiating the recording bit Rb with the near-field light. This allows the track Tr on which the reference signal is recorded to be heated to a predetermined temperature using the thermally-assisted magnetic head.

As described above, according to the present embodiment, the distribution width of the Curie temperatures of the plurality of magnetic grains that form the magnetic recording layer of the magnetic disk can be accurately estimated. Then, as described above, by estimating the distribution width of the Curie temperatures of the plurality of magnetic grains that form the magnetic recording layer of the magnetic disk, pass/fail determination regarding characterizations (SN ratio, BER, and the like) of the magnetic disk can be performed.

(Configuration of Thermally-Assisted Magnetic Disk Device)

As described above, according to the present embodiment, the distribution width of the Curie temperatures of the plurality of magnetic grains that form the magnetic recording layer of the magnetic disk can be accurately estimated. Next, an example of a specific configuration of the thermally-assisted magnetic disk device having the thermally-assisted magnetic head that can be used in the recording step, the heating step, and the measurement step in the present embodiment is explained.

Figure 8:
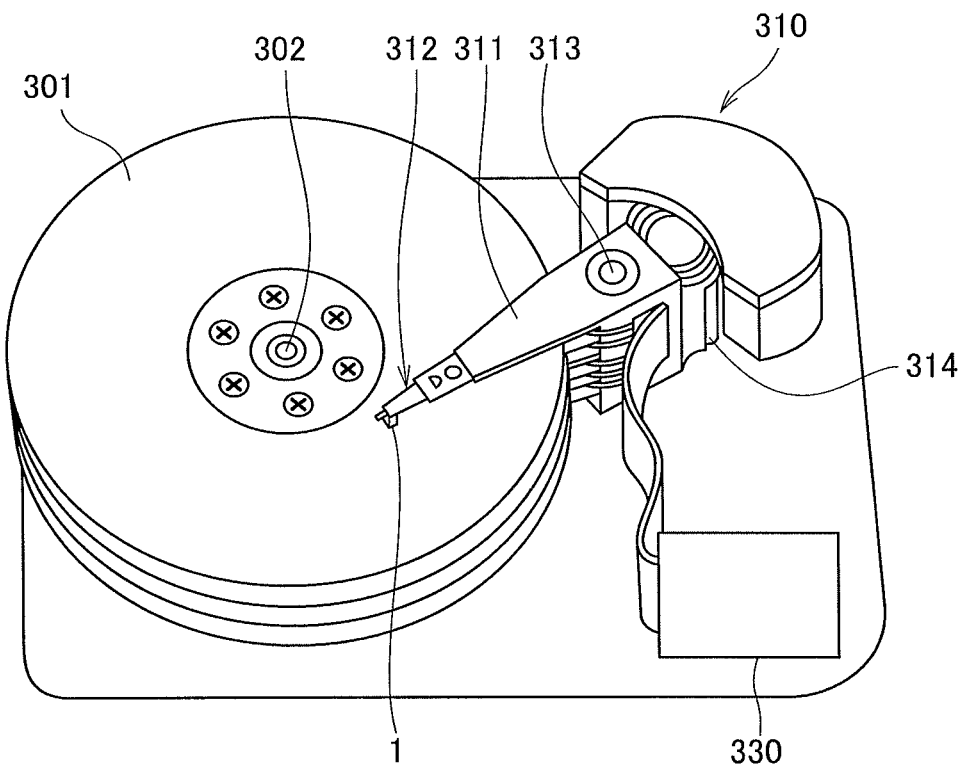
FIG. 8 is a perspective view schematically illustrating a configuration (an example) of a thermally-assisted magnetic disk device used in the embodiment of the present invention.
Figure 9:
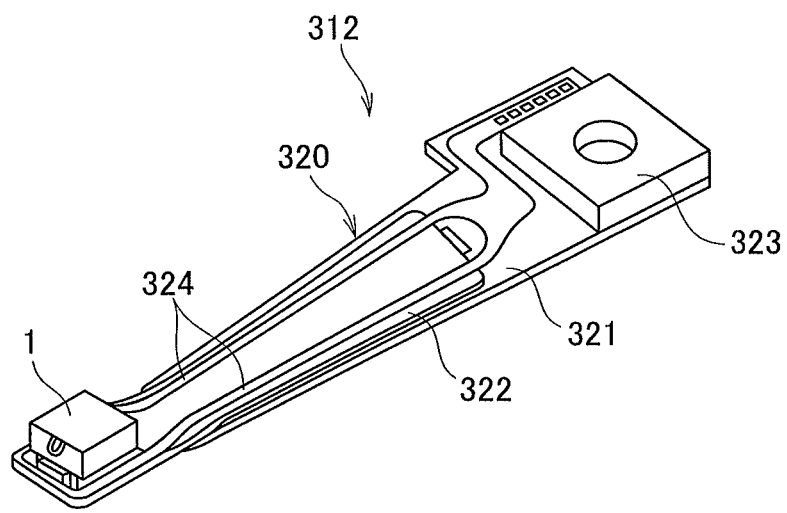
FIG. 9 is a perspective view schematically illustrating a head gimbal assembly (HGA) in the thermally-assisted magnetic disk device illustrated in FIG. 8.
Figure 10:
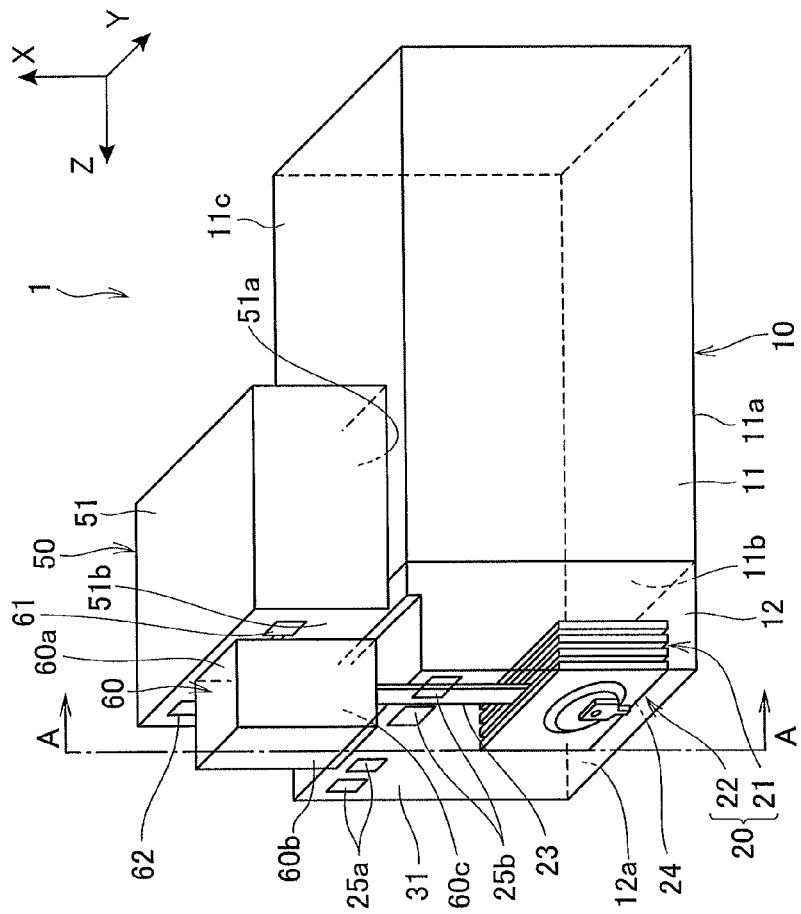
FIG. 10 is a perspective view illustrating a magnetic head in the thermally-assisted magnetic disk device illustrated in FIG. 8.

FIG. 8 is a perspective view schematically illustrating an example of a thermally-assisted magnetic disk device in the present embodiment. FIG. 9 is a perspective view schematically illustrating a head gimbal assembly (HGA) in the thermally-assisted magnetic disk device. FIG. 10 is a perspective view illustrating a magnetic head in the thermally-assisted magnetic disk device.

As illustrated in FIG. 8, the thermally-assisted magnetic disk device for which characterization evaluation is to be performed in the present embodiment is provided with a plurality of magnetic disks 301 that rotate about a rotation axis of a spindle motor 302, an assembly carriage device 310 on which a plurality of drive arms 311 are provided, a head gimbal assembly (HGA) 312 that is attached on a front end portion of each of the drive arms 311 and has a magnetic head 1 that is a thin film magnetic head, and a control circuit 330 for controlling the write and read operations of the magnetic head 1 and the light emission operation of the laser diode that is a light source emitting laser light used in thermally-assisted magnetic recording (to be described later). The magnetic disk 301 is the magnetic disk 301 of which the Curie temperature distribution width is to be estimated in the present embodiment.

The assembly carriage device 310 is a device for positioning the magnetic head 1 on the magnetic disk 301. In the assembly carriage device 310, the drive arms 311 are stacked in a direction along a pivot bearing shaft 313, and are angularly swingable about the pivot bearing shaft 313 by a voice coil motor (VCM) 314.

The structure of the thermally-assisted magnetic disk device in the present embodiment is not limited to the structure described above, and may include only one magnetic disk 301, one drive arm 311, one HGA 312, and one magnetic head 1.

In the HGA 312 illustrated in FIG. 9, a suspension 320 includes a load beam 321, a flexure 322 that is fixed on the load beam 321 and has elasticity, and a base plate 323 provided on a base portion of the load beam 321. Further, on the flexure 322, a wiring member 324 configured with a lead conductor and connection pads electrically connected to both ends of the lead conductor is provided. The magnetic head 1 in the present embodiment is fixed on the flexure 322 at a front end portion of the suspension 320 such that the magnetic head 1 opposes a surface of each magnetic disk 301 with a predetermined gap (flying height). Further, one end of the wiring member 324 is electrically connected to a terminal electrode of the magnetic head 1 in the present embodiment.

As illustrated in FIG. 10, the magnetic head 1 in the present embodiment includes a slider 10 and a light source unit 50. The slider 10 is formed from ALTIC ($Al_2O_3$—TiC) and the like, and is provided with a slider substrate 11 having an air bearing surface (ABS) 11a as a medium opposing surface that is processed to gain a proper flying height, and a head part 12 formed on an element formation surface 11b that is perpendicular to the ABS 11a.

Further, the light source unit 50 is formed from ALTIC (Al$_2$O$_3$—TiC) and the like, and is provided with a unit substrate 51 having a joining surface 51a, and a laser diode 60 as a light source provided on a light source installation surface 51b that is perpendicular to the joining surface 51a.

Here, the slider 10 and the light source unit 50 are joined with each other by joining a back surface 11c of the slider substrate 11 and the joining surface 51a of the unit substrate 51. The back surface 11c of the slider substrate 11 means an end surface on an opposite side of the ABS 11a of the slider substrate 11. The magnetic head 1 in the present embodiment may also be configured to have the laser diode 60 directly mounted on the slider 10, without using the light source unit 50.

The head part 12 formed on the element formation surface 11b of the slider substrate 11 is provided with a head element 20 having an MR element 21 for reading out data from the magnetic disk 301 and an electromagnetic transducer element 22 for writing data to the magnetic disk 301, a waveguide 23 for guiding laser light from the laser diode 60 provided in the light source unit 50 to the air bearing surface side, a plasmon generator 24 that, together with the waveguide 23, configures a near-field light generating optical system, a protective layer 31 formed on the element formation surface 11b in a manner covering the MR element 21, the electromagnetic transducer element 22, the waveguide 23 and the plasmon generator 24, a pair of first terminal electrodes 25a that are exposed on an upper surface of the protective layer 31 and are electrically connected to the MR element 21, and a pair of second terminal electrodes 25b that are exposed on an upper surface of the protective layer 31 and are electrically connected to the electromagnetic transducer element 22. These first and second terminal electrodes 25a and 25b are electrically connected to the connection pads of the wiring member 324 provided on the flexure 322 (see FIG. 9).

One end of the MR element 21, one end of the electromagnetic transducer element 22 and one end of the plasmon generator 24 respectively reach a head part end surface 12a that is an air bearing surface of the head part 12. Here, the head part end surface 12a and the ABS 11a form the entire air bearing surface of the magnetic head 1 in the present embodiment.

When actual reading or writing is performed, the magnetic head 1 hydrodynamically flies with a predetermined flying height on a surface of a rotating magnetic disk 301. In this case, end surfaces of the MR element 21 and the electromagnetic transducer element 22 oppose a surface of the magnetic recording layer of the magnetic disk 301 maintaining a suitable magnetic spacing therebetween. In this state, the MR element 21 performs reading by sensing a data signal magnetic field from the magnetic recording layer, and the electromagnetic transducer element 22 performs writing by applying a data signal magnetic field to the magnetic recording layer.

Here, when writing, the laser light propagated from the laser diode 60 of the light source unit 50 through the waveguide 23 couples with the plasmon generator 24 in a surface plasmon mode and excites a surface plasmon in the plasmon generator 24. The surface plasmon generates near-field light at an end portion on the head part end surface 12a side of the plasmon generator 24 by propagating through a projection part 241 (see FIG. 12) of the plasmon generator 24 (to be described later) toward the head part end surface 12a. The near-field light reaches the surface of the magnetic disk 301 and heats a magnetic recording layer portion of the magnetic disk 301, and thereby, the anisotropy magnetic field (coercive force) of that portion is reduced to a value that allows writing to be performed. By applying a recording magnetic field to the portion where the anisotropy magnetic field has been reduced, the thermally-assisted magnetic recording can be performed.

Figure 11:
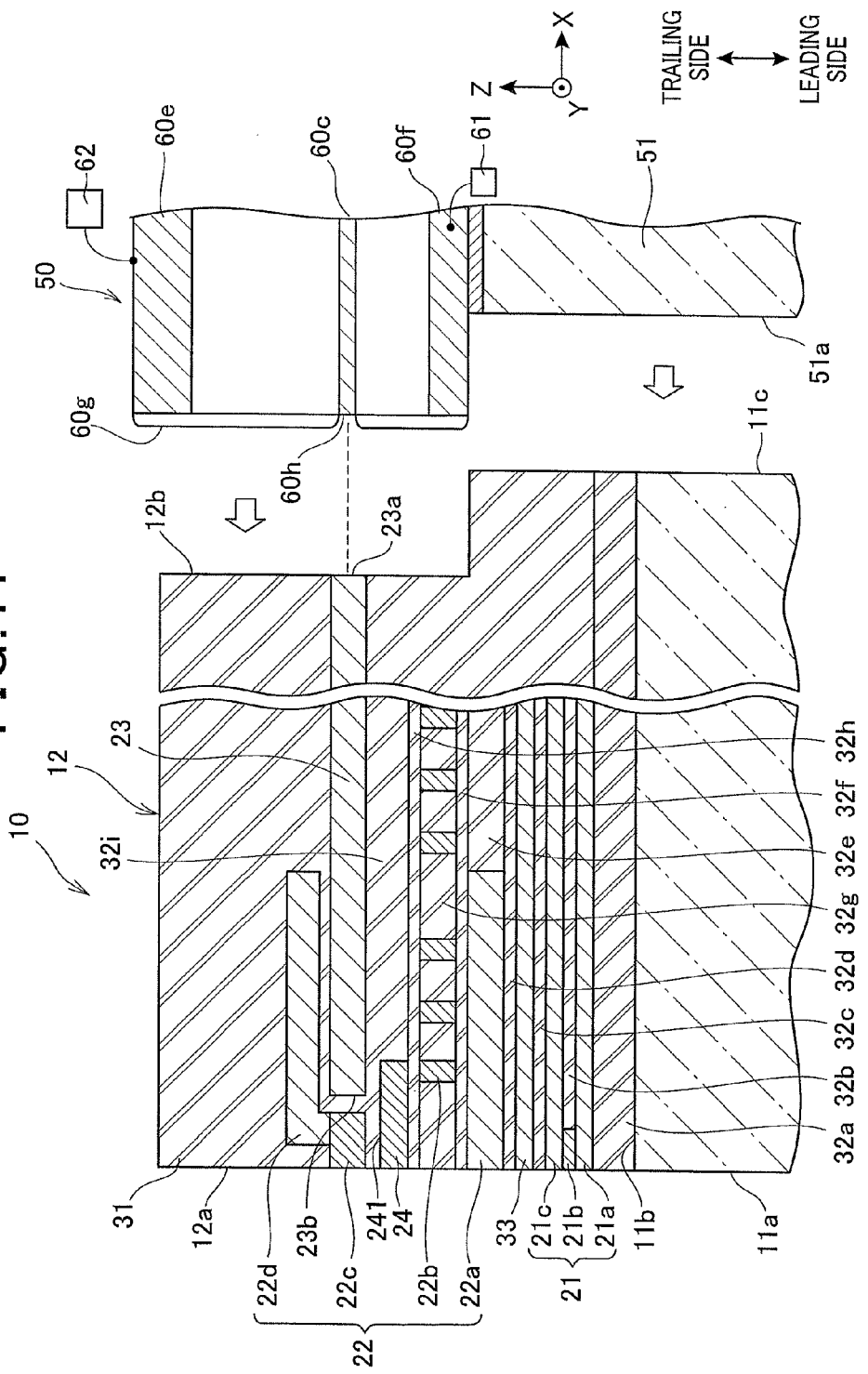
FIG. 11 is a cross-sectional view (XZ plane) along a line A-A in FIG. 10 and schematically illustrates a configuration of a main part of the magnetic head illustrated in FIG. 10.

FIG. 11 schematically illustrates a configuration of the magnetic head 1 in the present embodiment and is a cross-sectional view along a line A-A in FIG. 10 (XZ plane).

As illustrated in FIG. 11, the MR element 21 has a lower shield layer 21a formed on a first insulating layer 32a on the element formation surface 11b of the slider substrate 11, a MR multilayer body 21b formed on the lower shield layer 21a, and an upper shield layer 21c formed on the MR multilayer body 21b. On the periphery of the MR multilayer body 21b, a second insulating layer 32b is provided between the lower shield layer 21a and the upper shield layer 21c. The lower shield layer 21a and the upper shield layer 21c prevent the MR multilayer body 21b from being affected by an external magnetic field that acts as noise.

The lower shield layer 21a and the upper shield layer 21c are, for example, magnetic layers having a thickness of about 0.5-3 μm formed by a frame platting method, a sputtering method, or the like, and are composed of, for example, a soft magnetic material such as NiFe (permalloy), FeSiAl (sendust), CoFeNi, CoFe, FeN, FeZrN, and CoZrTaCr, or a multilayer film of these materials.

The MR multilayer 21b is a magnetically sensitive part that senses a signal magnetic field using the MR effect, and, for example, may be any one of a current in plane-giant magnetoresistive (CIP-GMR) multilayer body that uses a current-in-plane giant magnetoresistive effect, a current perpendicular to plane-gient magnetoresistive (CPP-GMR) multilayer body that uses a current-perpendicular-to-plane giant magnetoresistive effect, and a tunnel-magnetoresistive (TMR) multilayer body that uses a tunnel magnetoresistive effect. When the MR multilayer body 21b is a CPP-GMR multilayer body or a TMR multilayer body, the lower shield layer 21a and the upper shield layer 21c also function as electrodes. On the other hand, when the MR multilayer body 21b is a CIP-GMR multilayer body, insulating layers are provided respectively between the MR multilayer body 21b and the lower shield layer 21a, and between the MR multilayer body 21b and the upper shield layer 21c, and an MR lead layer that is electrically connected to the MR multilayer body 21b is further provided.

When the MR multilayer body 21b is a TMR multilayer body, the MR multilayer body 21b has a structure in which an antiferromagnetic layer, a magnetization pinned layer, a tunnel barrier layer, and a magnetization free layer are sequentially laminated. The antiferromagnetic layer has a thickness of about 5-15 nm and is composed of, for example, IrMn, PtMn, NiMn, RuRhMn and the like. The magnetization pinned layer has a structure in which two ferromagnetic layers composed of, for example, CoFe and the like sandwich therebetween a nonmagnetic metal layer composed of Ru and the like, and has the magnetization direction pinned by the antiferromagnetic layer. The tunnel barrier layer is composed of a nonmagnetic dielectric material produced by oxidizing a metal film having a thickness of about 0.5-1 nm composed of, for example, Al, AlCu, Mg and the like by oxygen introduced into a vacuum device or by natural oxidation. The magnetization free layer is composed of a two-layer film of ferromagnetic materials including, for example, a layer of CoFe and the like having a thickness of about 1 nm and a layer of NiFe and the like having a thickness of about 3-4 nm, and forms tunnel exchange coupling with the magnetization pinned layer via the tunnel barrier layer.

The head part 12 in the present embodiment is provided with a third insulating layer 32c provided on the upper shield layer 21c, an interelement shield layer 33 provided on the third insulating layer 32c, and a fourth insulating layer 32d provided on the interelement shield layer 33. The interelement shield layer 33 may also be formed from a soft magnetic material, and has a function to shield the MR element 21 from a magnetic field generated by the electromagnetic transducer element 22 provided on the fourth insulating layer 32d. The third insulating layer 32c and the interelement shield layer 33 may be omitted.

The electromagnetic transducer element 22 is for perpendicular magnetic recording and is provided with a lower yoke layer 22a provided on the fourth insulating layer 32d, a writing coil 22b provided on the lower yoke layer 22a, a magnetic pole 22c that reaches the head part end surface 12a so as to form a portion of the head part end surface 12a above the writing coil 22b, an upper yoke layer 22d provided on the magnetic pole 22c, and two linkage parts 22e, 22e (see FIG. 12) that are provided on the lower yoke layer 22a in a manner sandwiching the waveguide 23 (to be described later) from both sides in the Y-axis direction (track width direction) and link the lower yoke layer 22a and the upper yoke layer 22d. The writing coil 22b has a spiral structure that winds the two linkage layers 22e and 22e (see FIG. 12) together so as to at least pass between the lower yoke layer 22a and the upper yoke layer 22d during one turn.

The head part 12 in the present embodiment is provided with a fifth insulating layer 32e provided around the lower yoke layer 22a on the fourth insulating layer 32d, a sixth insulating layer 32f provided on the lower yoke layer 22a and the fifth insulating layer 32e, a seventh insulating layer 32g provided between the windings of the writing coil 22b and around the writing coil 22b, an eighth insulating layer 32h provided on the writing coil 22b and the seventh insulating layer 32g, and a ninth insulating layer 32i provided around the plasmon generator 24 (to be described later) on the eighth insulating layer 32h.

In the head part 12 in the present embodiment, the lower yoke layer 22a, the linkage layers 22e, the upper yoke layer 22d, and the magnetic pole 22c form a magnetic guide path that allows the passage of magnetic flux corresponding to the magnetic field generated by the writing coil 22b and guides the magnetic flux to the magnetic recording layer (perpendicular magnetization layer) of the magnetic disk 301. The most leading side of the end surface of the magnetic pole 22c that forms a portion of the head part end surface 12a becomes a point that generates a recording magnetic field.

It is preferable that the magnetic pole 22c be formed from a soft magnetic material having a saturation magnetic flux density higher than the upper yoke layer 22d. For example, the magnetic pole 22c is formed from a soft magnetic material that is an iron-based alloy material containing Fe as a main component, such as FeNi, FeCo, FeCoNi, FeN, or FeZrN.

The end surface on the head part end surface 12a side of the upper yoke layer 22d is located on the head part rear end surface 12b side a predetermined length deep from the head part end surface 12a along the X-axis direction without reaching the head part end surface 12a. This allows the magnetic flux to be concentrated on the magnetic pole 22c and the intensity of the magnetic field generated by the magnetic pole 22c to be enhanced.

The writing coil 22b is formed from, for example, a conductive material such as Cu (copper). The writing coil 22b in the present embodiment has one layer. However, the writing coil 22b may also have two or more layers, and may also be a helical coil arranged in a manner sandwiching the upper yoke layer 22d therebetween. Further, the number of turns of the writing coil 22b is not particularly limited. For example, the number of turns of the writing coil 22b may be configured to be 2-7 turns.

The lower yoke layer 22a is formed on the fourth insulating layer 32d that is composed of an insulating material such as $Al_2O_3$ (alumina), and functions as a magnetic guide path guiding the magnetic flux returned from the soft magnetic under layer provided under the magnetic recording layer (perpendicular magnetization layer) of the magnetic disk 301. The lower yoke layer 22a is composed of a soft magnetic material.

As viewed from the ABS 11a (head part end surface 12a), the waveguide 23 is provided at a location deeper than the magnetic pole 22c in the X-axis direction (height direction). The plasmon generator 24 is provided below (on the leading side of) the magnetic pole 22c. The waveguide 23 and the plasmon generator 24 form an optical system for near-field light generation in the head part 12.

The waveguide 23 extends parallel to the element formation surface 11b from a rear end surface 23a that forms a portion of the head part rear end surface 12b toward a rear end surface of the magnetic pole 22c such that a predetermined gap is maintained between the waveguide 23 and the rear end surface of the magnetic pole 22c so as to avoid contacting the magnetic pole 22c. Further, the lower surface (a portion of a side surface) of the waveguide 23 and a portion of the projection part 241 of the plasmon generator 24 oppose each other with a predetermined gap, and the portion that is sandwiched thereby forms a buffer portion 40 having a refractive index lower than the refractive index of the waveguide 23.

The buffer portion 40 functions to cause the laser light propagating though the waveguide 23 to couple with the plasmon generator 24 in a surface plasmon mode. The buffer portion 40 may be a portion of the ninth insulating layer 32i, and may also be a new layer provided separately from the ninth insulating layer 32i.

The plasmon generator 24 is provided so that the projection part 241 respectively opposes the magnetic pole 22c and the waveguide 23. Specific configurations of the magnetic pole 22c, the waveguide 23 and the plasmon generator 24 will be described later.

As illustrated in FIG. 11, the light source unit 50 is provided with the unit substrate 51, the laser diode 60 provided on the light source installation surface 51b of the unit substrate 51, a first drive terminal electrode 61 electrically connected to an electrode 60f that forms the lower surface of the laser diode 60, and a second drive terminal electrode 62 electrically connected to an electrode 60e that forms the upper surface of the laser diode 60. The first and second drive terminal electrodes 61 and 62 are electrically connected to the connection pads of the wiring member 324 provided on the flexure 322 (see FIG. 9). When a predetermined voltage is applied to the laser diode 60 via the first and second drive terminal electrodes 61 and 62, laser light is emitted from a light emission center 60h located on a light emission surface of the laser diode 60. Here, in the head structure as illustrated in FIG. 11, it is preferable that the oscillation direction of the electric field of the laser light generated by the laser diode 60 be perpendicular to a lamination layer plane of an active layer 60d (Z-axis direction). That is, it is preferable that the laser light generated by the laser diode 60 be a polarization of a TM mode. This allows the laser light propagating through the waveguide 23 to suitably couple via the buffer portion 40 with the plasmon generator 24 in a surface plasmon mode.

As the laser diode 60, those commonly used for communications, optical disk storage, material analysis, and the like, such as InP-based, GaAs-based, and GaN-based laser diodes, can be used. The wavelength $\lambda_L$ of the emitted laser light may be in the range of 375 nm-1.7 µm, for example.

Specifically, for example, an InGaAsP/InP-based quaternary mixed crystal laser diode having a possible wavelength range of 1.2-1.67 µm can be used. The laser diode 60 has a multilayer structure containing the upper electrode 60e, the active layer 60c, and the lower electrode 60f. Around a cleavage surface of this multilayer structure, a reflection layer is formed for exciting oscillation by total reflection. A reflection layer 60g is provided with an opening at the location of the active layer 60c that contains the light emission center 60h. Here, the laser diode 60 can have a thickness $T_{LA}$ of about 60-200 µm, for example.

Further, to drive the laser diode 60, a power source in the magnetic disk device can be used. In practice, the magnetic disk device is usually provided with a power source of about 5V, for example, and has a voltage that is sufficient for laser oscillation operation. Further, power consumption of the laser diode 60 is, for example, about several tens of mW, which can be sufficiently covered by the power source in the magnetic disk device. In practice, a predetermined voltage is applied by this power source between the first drive terminal electrode 61 that is electrically connected to the lower electrode 60f and the second drive terminal electrode 62 that is electrically connected to the upper electrode 60e, and by causing the laser diode 60 to oscillate, laser light is emitted from the opening of the reflection layer 60g that contains the light emission center 60h. The laser diode 60 and the first and second drive terminal electrodes 61 and 62 are not intended to be limited by the embodiment described above. For example, in the laser diode 60, it is also possible to reverse up and down of the electrodes and join the upper electrode 60e to the light source installation surface 51b of the unit substrate 51. Further, it is also possible to install a laser diode on the element formation surface 11b of the magnetic head 1, and optically connect the laser diode and the waveguide 23. Further, without being provided with the laser diode 60, the magnetic head 1 may be connected, for example, via an optical fiber and the like, to a light emission center of a laser diode provided in the magnetic disk device and the rear end surface 23a of the waveguide 23.

The sizes of the slider 10 and the light source unit 50 are arbitrary. For example, the slider 10 may be a so-called femto slider having a width in the track width direction (Y-axis direction) of 700 µm×a length (in the Z-axis direction) of 850 µm×a thickness (in the X-axis direction) of 230 µm. In this case, the light source unit 50 may have a size slightly smaller than that of the slider 10, for example, a width in the track width direction of 425 µm×a length of 300 µm×a thickness of 300 µm.

The magnetic head 1 is configured by connecting the light source unit 50 and the slider 10 described above. In connecting the light source unit 50 and the slider 10, the joining surface 51a of the unit substrate 51 and the back surface 11c of the slider substrate 11 are joined. However, in this case, the positions of the unit substrate 51 and the slider substrate 11 are determined such that the laser light generated from the laser diode 60 is incident on the rear end surface 23a on the side opposite to the ABS 11a at the waveguide 23.

Figure 12:
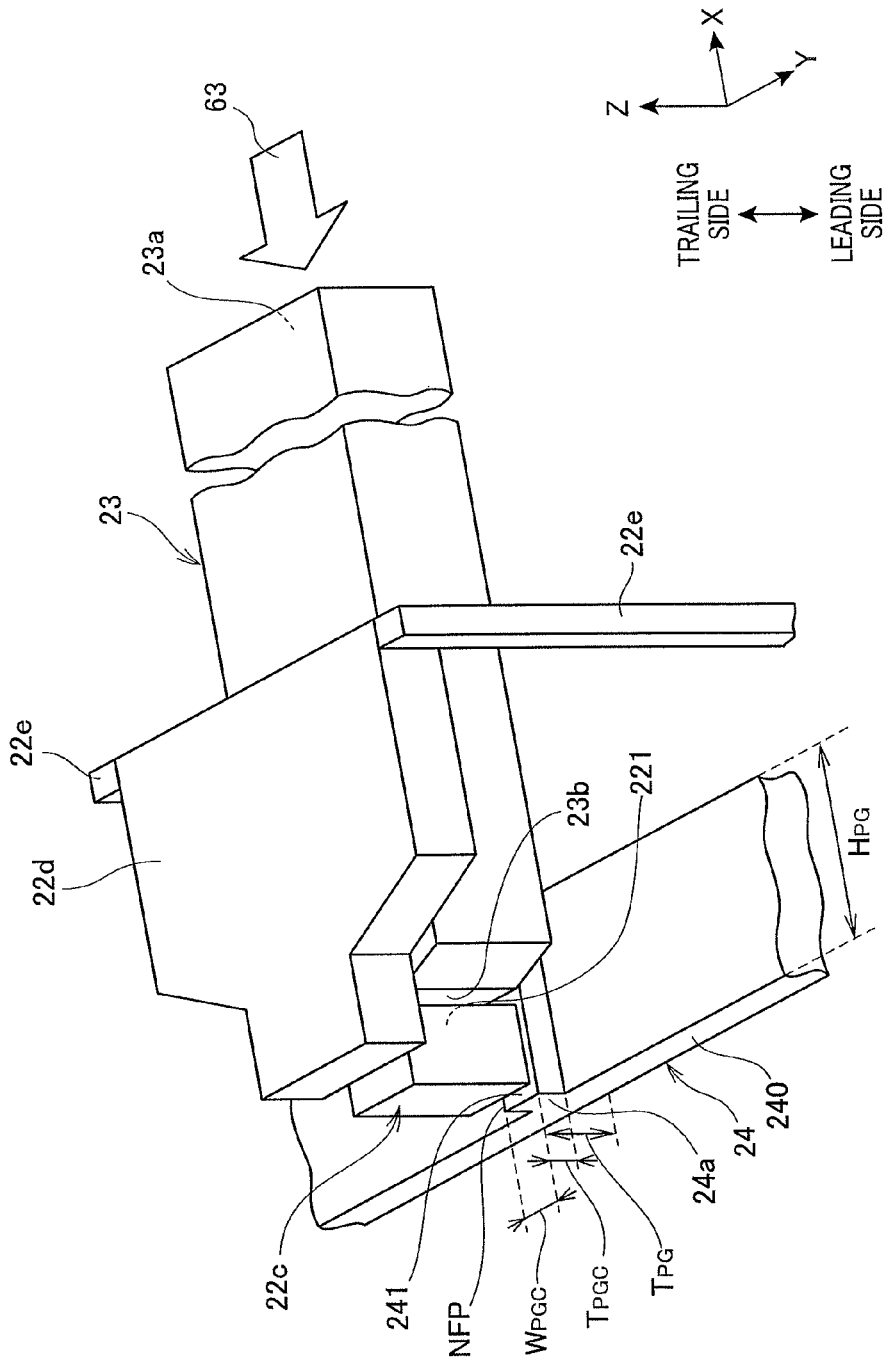
FIG. 12 is a perspective view schematically illustrating configurations of a waveguide, a plasmon generator and a magnetic pole of the magnetic head illustrated in FIG. 10.

FIG. 12 is a perspective view schematically illustrating configurations of the waveguide 23, the plasmon generator 24 and the magnetic pole 22c of the magnetic head 1 in the present embodiment. In FIG. 12, the head part end surface 12a that contains the location where the recording magnetic field and the near-field light are emitted toward the magnetic recording medium is located on the left side.

As illustrated in FIG. 12, the magnetic head 1 in the present embodiment is provided with the waveguide 23 for propagating laser light 63 for near-field light generation, and the plasmon generator 24 having the projection part 241 that propagates a surface plasmon excited by the laser light (waveguide light) 63 and that opposes the lower surface of the waveguide 23 with a predetermined gap.

The plasmon generator 24 is provided with a near-field light generating end surface 24a that reaches the head part end surface 12a. Further, a portion sandwiched between a portion of a side surface of the waveguide 23 and a portion of the upper surface (side surface) of the plasmon generator 24 including the projection part 241 becomes the buffer portion 40 (see FIG. 11). That is, a portion of the projection part 241 is covered by the buffer portion 40. The buffer portion 40 functions to cause the laser light (waveguide light) 63 to couple with the plasmon generator 24 in a surface plasmon mode. Further, the projection part 241 functions to propagate the surface plasmon excited by the laser light (waveguide light) 63 to the near-field light generating end surface 24a.

The side surface of the waveguide 23 refers to an end surface that is the end surface surrounding the waveguide 23 excluding an end surface 23b located on the head part end surface 12a side and the rear end surface 23a on the opposite side of the end surface 23b. The side surface of the waveguide 23 is a surface allowing the laser light (waveguide light) 63 propagating through the waveguide 23 (which is equivalent to a core) to be totally reflected. In the present embodiment, a portion of the side surface of the waveguide 23 that is in contact with the buffer portion 40 becomes the lower surface of the waveguide 23.

More specifically, the laser light (waveguide light) 63 propagated to the vicinity of the buffer portion 40 couples with optical configurations of the waveguide 23 having a predetermined refractive index $n_{WG}$, the buffer portion 40 having a predetermined refractive index $n_{BF}$ and the plasmon generator 24 composed of a conductive material such as metal, and induces a surface plasmon mode in the projection part 241 of the plasmon generator 24. That is, the laser light (waveguide light) 63 couples with the plasmon generator 24 in a surface plasmon mode. The induction of the surface plasmon mode is enabled by configuring the refractive index $n_{BF}$ of the buffer portion 40 to be smaller than the refractive index $n_{WG}$ of the waveguide 23 ($n_{BF}<n_{WG}$). In practice, evanescent light is excited in the buffer portion 40 from optical interface conditions of the waveguide 23 (which is the core) and the buffer portion 40. Next, in a form in which the evanescent light and charge fluctuation excited on the surface (projection part 241) of the plasmon generator 24 are coupled, the surface plasmon mode is induced and the surface plasmon 70 is excited (see FIG. 14). Here, the projection part 241 is located closest to the waveguide 23, and the width in the Y-axis direction is extremely small so that it is easy for an electric field to concentrate. Therefore, the surface plasmon 70 is easily excited.

As illustrated in FIG. 12, the plasmon generator 24 has a flat plate part 240, and the projection part 241 that projects from the flat plate part 240 toward the waveguide 23 side. An end surface that forms a portion of the head part end surface 12a becomes the near-field light generating end surface 24a.

A portion of the projection part 241 opposes the waveguide 23 via the buffer portion 40 and extends to the near-field light generating end surface 24a. This allows the plasmon generator 24 to realize a function of propagating the surface plasmon excited by the laser light (waveguide light) that propagated through the waveguide 23. That is, the plasmon generator 24 couples with the waveguide light in a surface plasmon mode and propagates the surface plasmon above the projection part 241. As a result, near-field light is generated from a near-field light generator NFP at the near-field light generating end surface 24a.

It is preferable that a projection height $T_{PGC}$ of the projection part 241 be 15-45 nm. Further, it is preferable that a width $W_{PGC}$ of the projection part 241 in the Y-axis direction at the near-field light generating end surface 24a be smaller than the wavelength of the laser light (waveguide light) 63 and be 15-30 nm. Further, the waveguide 23 is located on a more trailing side than the plasmon generator 24, and, when viewed from the air bearing surface side, a height $T_{PG}$ from the lower end of the flat plate part 240 to the upper end (upper surface) of the projection part 241 is preferably 65-205 nm, and more preferably about 130 nm. Further, a length $H_{PG}$ in the X-axis direction of the plasmon generator 24 is preferably 1.0-1.4 μm, and more preferably about 1.2 μm.

Figure 13A:
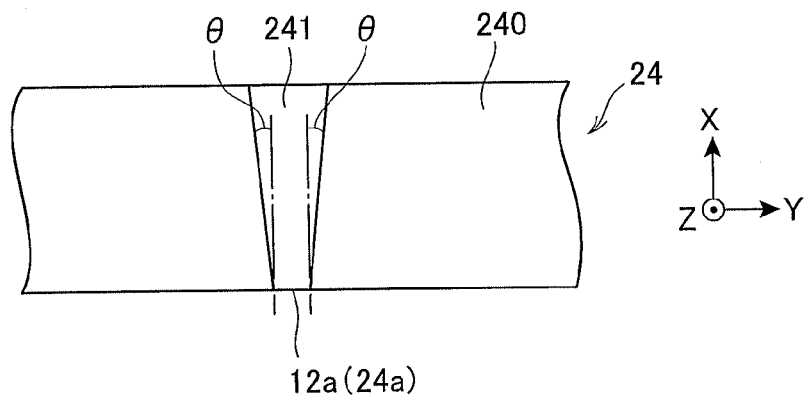
FIGS. 13A-13C are plan views schematically illustrating shapes of a projection part of the plasmon generator in the embodiment of the present invention.
Figure 13B:
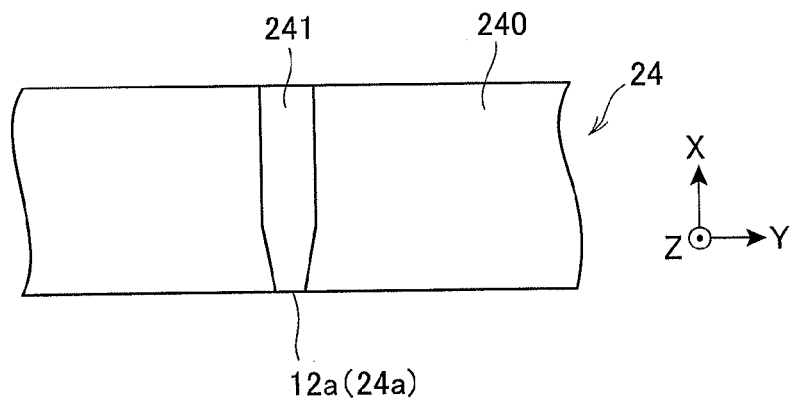
Figure 13C:
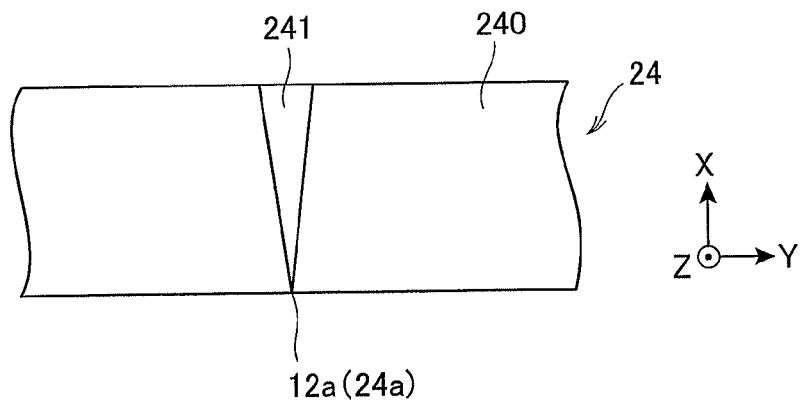

In the present embodiment, the shape of the upper surface of the projection part 241 is a rectangle. However, the shape of the upper surface of the projection part 241 is not limited to a rectangle. For example, as illustrated in FIG. 13A, the shape of the upper surface of the projection part 241 may be a trapezoidal shape formed from a short side located on the head part end surface 12a, a long side located on the head part rear end surface 12b side, and two oblique sides respectively connecting ends of the short side and the long side, and having a width in the Y-axis direction that gradually increases from the head part end surface 12a toward the head part rear end surface 12b side. Further, as illustrated in FIG. 13B, the shape of the upper surface of the projection part 241 may be such a shape that the width in the Y-axis direction gradually increase from the head part end surface 12a to a predetermined location along the X-axis direction, and the width in the Y-axis direction is constant from this location to the head part rear end surface 12b side. Further, as illustrated in FIG. 13C, the shape of the upper surface of the projection part 241 may be substantially a triangular shape having an apex located on the head part end surface 12a and the width in the Y-axis direction that gradually increases toward the head part rear end surface 12b side. By making the shape of the upper surface of the projection part 241 into these shapes, the light density of the near-field light radiated on the magnetic disk 301 can be increased and the light spot diameter can be reduced. In the case illustrated in FIG. 13A, the angle θ formed by each of the two oblique sides of the trapezoidal shape of the projection part 241 and the X-axis is preferably less than 10 degrees, more preferably 1-3 degrees, and particularly preferably about 2 degrees.

The flat plate part 240 of the plasmon generator 24 can function to release heat generated at the near-field light generator NFP at the near-field light generating end surface 24a of the plasmon generator 24 from the near-field light generator NFP. This allows excessive temperature rise in the plasmon generator 24 to be suppressed, and can contribute to avoiding an unnecessary projection of the near-field light generating end surface 24a and a significant decrease in light use efficiency of the plasmon generator 24.

It is preferable that the plasmon generator 24 be formed of a conductive material such as a metal, for example, Pd, Pt, Rh, Ir, Ru, Au, Ag or Cu, or an alloy of at least two kinds of metals selected from these metals.

The waveguide 23 is provided at a location deeper than the magnetic pole 22c in the X-axis direction (height direction) with a predetermined gap relative to a rear end surface 221 of the magnetic pole 22c (see FIG. 12). An insulating layer 32j (see FIG. 14) is provided between the rear end surface 221 of the magnetic pole 22c and the end surface 23b of the waveguide 23 (see FIG. 12).

With regard to the shape of the waveguide 23, the width in the track width direction (Y-axis direction) may be a constant. However, as illustrated in FIG. 12, the width may gradually increase from the end surface 23b of the waveguide 23 toward the deeper side in the X-axis direction (height direction). The width in the track width direction (Y-axis direction) at the rear end surface 23a of the waveguide 23 can be set to be, for example, about 0.5-20 μm. The width in the track width direction (Y-axis direction) at the end surface 23b can be set to be, for example, about 0.3-10 μm. The thickness in the Z-axis direction can be set to be about 0.1-4 μm. The length in the X-axis direction can be set to be, for example, about 10-300 μm.

The upper surface of the waveguide 23 is joined with the protective layer 31(see FIG. 11). The lower surface and the two end surfaces in the track width direction (Y-axis direction) of the waveguide 23 are joined with the ninth insulating layer 32i (see FIG. 11). Here, the waveguide 23 is composed of a material having the refractive index $n_{WG}$ higher than a refractive index $n_{IS}$ of a constituent material of the ninth insulating layer 32i and the protective layer. For example, when the wavelength $λ_L$ of the laser light is 600 nm and the ninth insulating layer 32i and the protective layer 31 are formed from $SiO_2$ (silicon dioxide; n=1.46), the waveguide 23 may be formed from $Al_2O_3$ (alumina; n=1.63). Further, when the ninth insulating layer 32i and the protective layer 31 are formed from $Al_2O_3$ (n=1.63), the waveguide 23 may be formed from $SiO_XN_Y$ (n=1.7-1.85), $Ta_2O_5$ (n=2.16), $Nb_2O_5$ (n=2.33), TiO (n=2.3-2.55), or $TiO_2$ (n=2.3-2.55). When the waveguide 23 is composed of such material, due to good optical characterization that the material has, propagation loss of the laser light (waveguide light) 63 can be kept low. Further, while the waveguide 23 functions as the core, the ninth insulating layer 32i and the protective layer 31 function as the cladding so that a total reflection condition is achieved on the entire side surface. This allows more laser light (waveguide light) 63 to reach the location of the buffer portion 40, and the propagation efficiency of the waveguide 23 to be improved.

Further, the waveguide 23 has multilayer structure of dielectric materials, and may have a structure in which a layer located closer to the plasmon generator 24 has a higher refractive index n. For example, such a multilayer structure is realized by sequentially laminating dielectric materials obtained by suitably varying values of composition ratios X and Y in $SiO_XN_Y$. The number of laminating layers can be, for example, 8-12 layers. As a result, when the laser light (waveguide light) 63 is linearly polarized in the Z-axis direction, the laser light (waveguide light) 63 can propagate more on the buffer portion 40 side in the Z-axis direction. In this case, by selecting the composition and layer thickness of each layer and the number of layers of the multilayer structure, a desired propagation location in the Z-axis direction of the laser light (waveguide light) 63 can be realized.

The buffer portion 40 is formed of a dielectric material having a refractive index $n_{BF}$ lower than the refractive index $n_{WG}$ of the waveguide 23. For example, when the wavelength $λ_L$ of the laser light is 600 nm and the waveguide 23 is formed from $Al_2O_3$ (alumina; n=1.63), the buffer portion 40 may be formed from $SiO_2$ (silicon dioxide; n=1.46). Further, when the waveguide 23 is formed from $Ta_2O_5$ (n=2.16), the buffer portion 40 may be formed from $SiO_2$ (n=1.46) or $Al_2O_3$ (n=1.63). In these cases, the buffer portion 40 can be a part of the ninth insulating layer 32i (see FIG. 11) that functions as the cladding and that is composed of $SiO_2$ (n=1.46) or $Al_2O_3$ (n=1.63). Further, the length $L_{BF}$ in the X-axis direction (see FIG. 14) of the buffer portion 40, which is the portion sandwiched by the lower surface of the waveguide 23 and the projection part 241, is preferably 0.5-5 μm, and is preferably larger than the wavelength $\lambda_L$ of the laser light (waveguide light) 63. In this case, this portion, for example, as compared to a so-called "focal region" of the case where the laser light is concentrated to the buffer portion 40 and the plasmon generator 24 and is coupled in a surface plasmon mode, is a much broader region and a very stable coupling in a surface plasmon mode is possible. Further, it is preferable that the thickness $T_{BF}$ in the Z-axis direction (see FIG. 14) of the buffer portion 40 be 10-200 nm. The length $L_{BF}$ and the thickness $T_{BF}$ of the buffer portion 40 are important parameters for obtaining suitable excitation and propagation of a surface plasmon.

The specific configuration of the thermally-assisted magnetic disk device described above is an example of a thermally-assisted magnetic disk device to which the characterization evaluation method according to the present embodiment is applicable. However, the configuration of the thermally-assisted magnetic disk device for which characterization evaluation is to be performed is not limited to that described above.

For example, when the projection part 241 that projects from the flat plate part 240 of the plasmon generator 24 is viewed from the head part end surface 12a side, the shape of the projection part 241 may be a substantially trapezoidal shape, a substantially inverted trapezoidal shape, and the like. When the projection part 241 is viewed from the head part end surface 12a side, a corner at the intersection of a lateral side (side along the Z-axis direction) of the projection part 241 and the flat plate part 240 may have a rounded shape.

Figure 15:
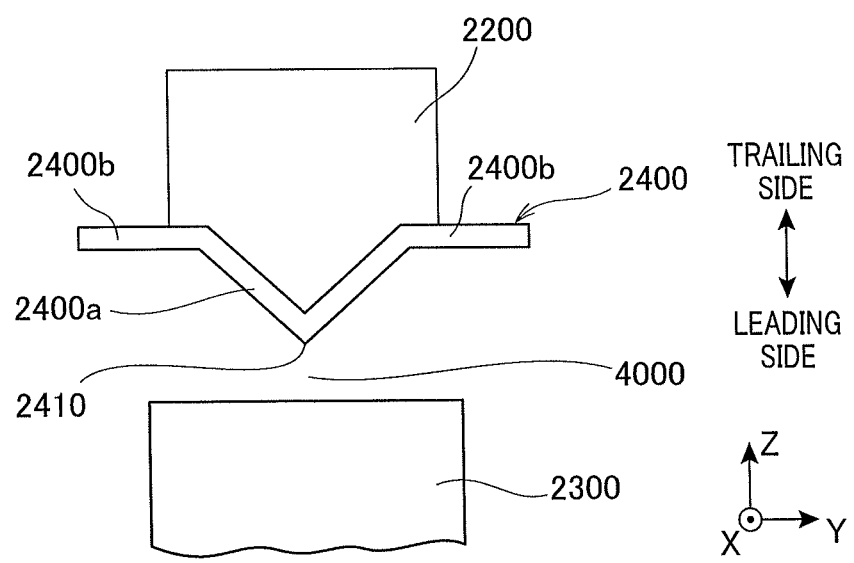
FIG. 15 is a plan view viewed from an air bearing surface side schematically illustrating another example of the configuration of the magnetic head in the embodiment of the present invention.

Further, as illustrated in FIG. 15, the magnetic head may be provided with a plasmon generator 2400 and a magnetic pole 2200, the plasmon generator 2400 being provided on a waveguide 2300 with a buffer portion 4000 interposed therebetween, and the magnetic pole 2200 being provided on the plasmon generator 2400. In this case, when viewed from the head part end surface side, the plasmon generator 2400 includes a substantially V-shaped part 2400a, an extended parts 2400b continued from upper end portions of the substantially V-shaped part 2400a and spreading in the Y-axis direction, and a propagation edge 2410 located at an apex of the substantially V-shaped part 2400a and extending in the X-axis direction. In the substantially V-shaped part 2400a of the plasmon generator 2400, a portion of the magnetic pole 2200 can be embedded.

Figure 14:
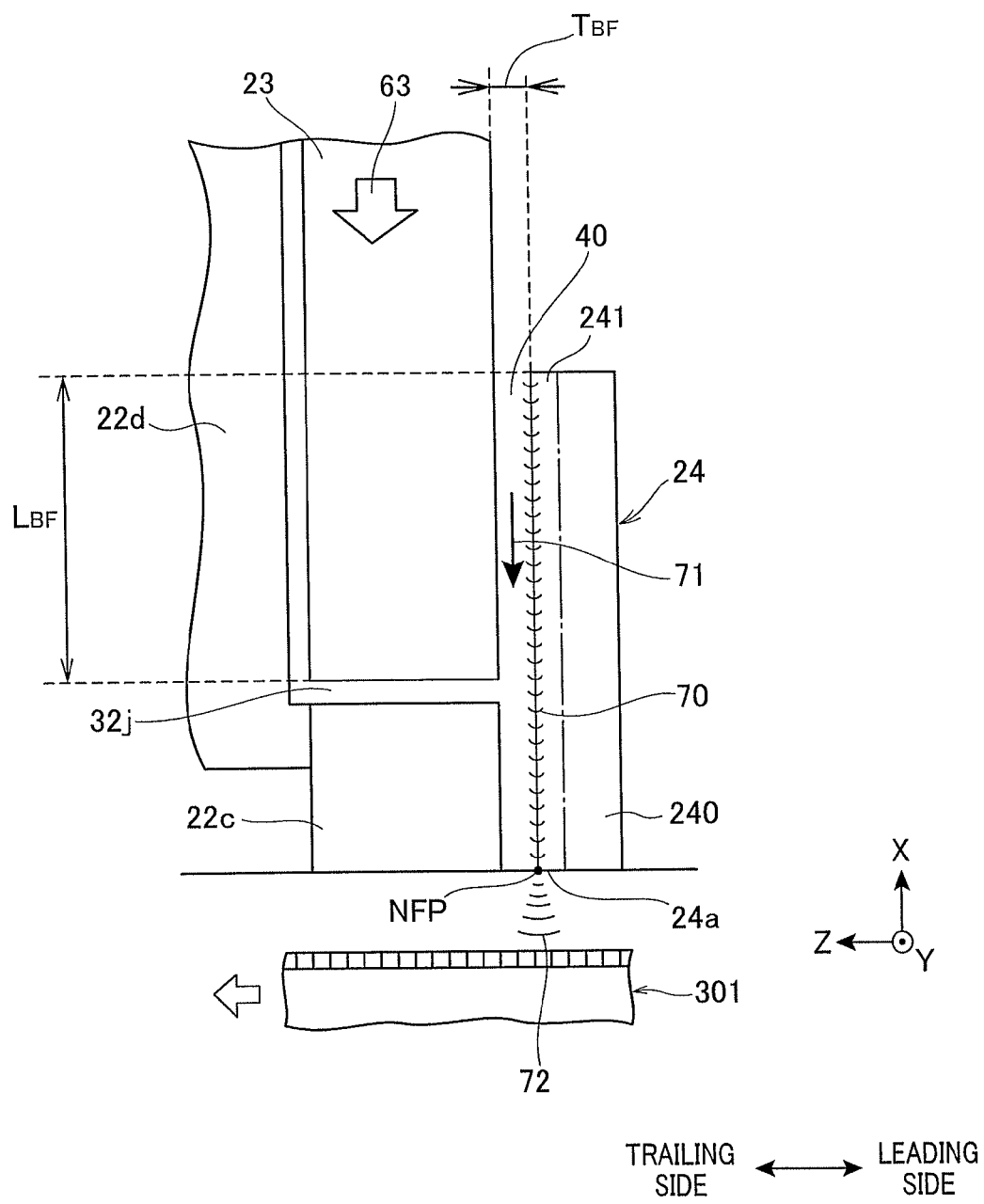
FIG. 14 is a cross-sectional view (XZ plane) schematically illustrating a thermally-assisted magnetic recording system using a surface plasmon mode in the magnetic head in the embodiment of the present invention.

Next, operation of the magnetic head 1 in the present embodiment having the above-described configuration is explained. FIG. 14 is a schematic view for explaining thermally-assisted magnetic recording using a surface plasmon mode in the magnetic head 1 in the present embodiment.

As illustrated in FIG. 14, when writing to the magnetic recording layer of the magnetic disk 301 by the electromagnetic transducer element 22 is performed, initially, the laser light (waveguide light) 63 emitted from the laser diode 60 of the light source unit 50 propagates through the waveguide 23. Next, the laser light (waveguide light) 63 that has propagated to the neighborhood of the buffer portion 40 couples with the optical configurations of the waveguide 23 having the refractive index $n_{WG}$, the buffer portion 40 having the refractive index $n_{BF}$ and the plasmon generator 24, which is composed of a conductive material such as a metal, to induce a surface plasmon mode on the projection part 241 of the plasmon generator 24. That is, the laser light (waveguide light) 63 couples with the plasmon generator 24 in a surface plasmon mode. In practice, evanescent light is excited in the buffer portion 40 from optical interface conditions of the waveguide 23 (which is the core) and the buffer portion 40. Next, in a form in which the evanescent light and fluctuation of charges excited on the metal surface (projection part 241) of the plasmon generator 24 are coupled, the surface plasmon mode is induced and the surface plasmon is excited. More precisely, the surface plasmon, which is an elementary excitation in this system, couples with an electromagnetic wave. Therefore, a surface plasmon polariton is excited. However, hereafter, as an abbreviation, the surface plasmon polariton is referred to a surface plasmon. The induction of the surface plasmon mode is enabled by configuring the refractive index $n_{BF}$ of the buffer portion 40 to be smaller than the refractive index $n_{WG}$ of the waveguide 23 ($n_{BF} < n_{WG}$) and further suitably selecting the length $L_{BF}$ in the X-axis direction of the buffer portion 40 (that is, the length of the coupling portion of the waveguide 23 and the plasmon generator 24) and the thickness $T_{BF}$ in the Z-axis direction of the buffer portion 40.

In the induced surface plasmon mode, the surface plasmon 70 is excited on the projection part 241 of the plasmon generator 24 and propagates on the projection part 241 along the direction of an arrow 71. The projection part 241 is not in contact with the magnetic pole 22c, and thus is not negatively affected by the magnetic pole 22c when the magnetic pole 22c is not properly adjusted to allow the surface plasmon to be efficiently excited. As a result, the surface plasmon can be intentionally propagated on the projection part 241.

As described above, by propagating on the projection part 241 along the direction of the arrow 71, the surface plasmon 70 reaches the head part end surface 12a. The surface plasmon 70, that is, an electric field, concentrates on the near-field light generator NFP at the near-field light generating end surface 24a to which the projection part 241 ends up. As a result, from the near-field light generator NFP, near-field light 72 is generated. The near-field light 72 is emitted toward the magnetic recording layer of the magnetic disk 301, reaches the surface of the magnetic disk 301, and heats a magnetic recording layer portion of the magnetic disk 301. Thus, the anisotropy magnetic field (coercive force) of the heated portion is reduced to a value that allows writing to be performed, and writing is performed by a magnetic field applied to this portion.

The embodiment explained above is described in order to facilitate understanding of the present invention and is not described in order to limit the present invention. Therefore, it is intended that each element disclosed in the above embodiment also includes all design modifications and equivalents that belong to the technical scope of the present invention.

In the above embodiment, the track Tr on which the reference signal is recorded in the magnetic disk 301 of which the Curie temperature distribution width is to be estimated is heated using the thermally-assisted magnetic disk device having the configuration described above. However, the present invention is not limited to this mode. For example, the track Tr may also be heated using a laser heating device and the like.

In the above embodiment, at least one track Tr on which the reference signal is recorded in the magnetic disk 301 of which the Curie temperature distribution width is to be estimated is heated. However, the present invention is not limited to this mode. For example, it is also possible to heat at least one recording bit on which a reference signal is recorded in the magnetic disk 301 and measure the reference signal recorded on the recording bit.

Further, in the above embodiment, after a reference signal is recorded on a predetermined track Tr, the track Tr of the magnetic disk 301 is heated while the heating temperature is gradually increased, and the signal intensity with respect to the reference signal after heating at each heating temperature is measured. However, the present invention is not limited to this mode. For example, after each signal intensity measurement, it is also possible to record (overwrite) again a reference signal on the track Tr. By doing so, without the need of heating the track Tr in a manner of transitioning from a low heating temperature to a high heating temperature, the heating temperature can be varied up and down for each heating. In this case, a plurality of heating conditions (heating temperatures) are set in advance, and the track Tr on which the reference signal is recorded is heated in each heating under an arbitrarily selected heating condition (heating temperature). However, in the case where in each heating step the heating is performed at a heating temperature lower than the heating temperature in the immediate previous heating step, the reference signal may be recorded (overwritten) again on the track Tr.

Further, in the above embodiment, the track Tr of the magnetic disk 301 is heated while the heating condition is varied (while the heating temperature is gradually increase), and the Curie temperature distribution width is estimated by measuring the signal intensities with respect to the reference signal after heating under each heating condition. However, the present invention is not limited to this mode. For example, a reference signal is recorded on each of a plurality of tracks (or a plurality of recording bits) of the magnetic disk 301, and all of the tracks (or recording bits) on each of which a reference signal is recorded are heated such that the heating condition (heating temperature) is different for each of the tracks (or recording bits). Next, the signal intensities with respect to the reference signal of each of the heated tracks (or recording bits) are respectively measured, and based on the obtained measured values, the Curie temperature distribution width is estimated. In this case, the heating condition (heating temperature) of each track (or recording bit) may be suitably set in a range from a temperature at which the signal intensity with respect to the reference signal recorded on the track (or recording bit) is only slightly reduced after heating (for example, the signal intensity with respect to the reference signal after heating is about 97% of the signal intensity with respect to the reference signal before heating) to a temperature at which the reproduction signal intensity with respect to the reference signal is substantially zero (for example, the attenuation rate from the reproduction signal intensity with respect to the reference signal before heating is 97% or more, and preferably is about 100%). Further, the number of tracks (or the number of recording bits) on which the reference signal is recorded can be suitably set according to the number of heating conditions (heating temperatures).

What is claimed is:

1. An estimation method for estimating a distribution width of Curie temperatures of a plurality of magnetic grains that form a magnetic recording layer of a magnetic recording medium used in thermally-assisted magnetic recording, comprising:
   a heating step in which a recording bit, on which a reference signal is recorded, is heated under each of a plurality of heating conditions having different heating temperatures, the recording bit being at least one recording bit in the magnetic recording medium;
   a measurement step in which a signal intensity with respect to the reference signal recorded in the recording bit after heating is measured under each of the heating conditions of the heating step;
   a determining step in which, using the signal intensity with respect to the reference signal measured in the measurement step for each of the different heating temperatures, the lowest Curie temperature of the plurality of magnetic grains, which is the heating temperature when the signal intensity with respect to the reference signal begins to decrease, and the highest Curie temperature of the plurality of magnetic grains, which is the heating temperature when the signal intensity with respect to the reference signal substantially becomes zero, are determined; and
   a calculation step, in which the difference of the highest Curie temperature and the lowest Curie temperature is calculated, by a computer, as the distribution width of Curie temperatures of the plurality of magnetic grains that form the magnetic recording layer.

2. The estimation method of a Curie temperature distribution width according to claim 1, wherein
   in the heating step, heating is performed such that a temperature at a substantial center point of the recording bit in a track width direction becomes the same as the heating temperature in each of the heating conditions, and
   using the signal intensities with respect to the reference signal at the substantial center point of the recording bit, the distribution width of the Curie temperatures of the plurality of magnetic grains that form the magnetic recording layer is calculated.

3. The estimation method of the Curie temperature distribution width according to claim 1, wherein
   the recording bit is recording bits at a plurality of locations in the magnetic recording medium,
   using the signal intensities with respect to the respective reference signals of the recording bits at the plurality of locations, differences between a highest Curie temperature and a lowest Curie temperature of a plurality of magnetic grains respectively contained in the recording bits at the plurality of locations are calculated, and
   using the differences respectively calculated at the recording bits at the plurality of locations, the distribution width of the Curie temperatures of the plurality of magnetic grains that form the magnetic recording layer are calculated.

4. The estimation method of the Curie temperature distribution width according to claim 1, wherein
   in the heating step, a thermally-assisted magnetic recording head is used, which comprises:
      a magnetic pole generating a recording magnetic field from an end surface that forms a portion of an air bearing surface opposing the magnetic recording medium;
      a waveguide through which light for exciting a surface plasmon propagates; and
      a plasmon generator generating, by coupling with the light in a surface plasmon mode, near-field light from a near-field light generating end surface that forms a portion of the air bearing surface, and
   the recording bit on which the reference signal is recorded is heated by irradiating the recording bit with the near-field light generated by the plasmon generator without applying the recording magnetic field from the magnetic pole to the magnetic recording medium.

5. The estimation method of the Curie temperature distribution width according to claim 4, wherein
   the thermally-assisted magnetic recording head further comprises a laser diode radiating the waveguide with light propagating through the waveguide, and in the heating step, the heating temperature of each of the heating conditions is set by setting a operating current applied to the laser diode.

6. The estimation method of the Curie temperature distribution width according to claim 1, wherein in the heating step, a track on which a reference signal is recorded is heated under each of a plurality of heating conditions having different heating temperatures, the track being at least one track in the magnetic recording medium, and in the measurement step, a signal intensity with respect to the reference signal in the track after heating is measured under each of the heating conditions of the heating step.

7. An estimation method for estimating a Curie temperature distribution width of a plurality of magnetic grains that form a magnetic recording layer of a magnetic recording medium used in thermally-assisted magnetic recording, comprising:

a heating step in which each of a plurality of recording bits, on which a reference signal is recorded, is heated under a different one of a plurality of heating conditions, each heating condition having a different heating temperature, the recording bits being in the magnetic recording medium;

a measurement step in which a signal intensity with respect to the reference signal in each of the recording bits after each heating is measured;

a determining step in which, using the signal intensity with respect to the reference signal measured in the measurement step for each of the different heating temperatures for each recording bit, the lowest Curie temperature of the plurality of magnetic grains, which is the heating temperature when the signal intensity with respect to the reference signal begins to decrease, and the highest Curie temperature of the plurality of magnetic grains, which is the heating temperature when the signal intensity with respect to the reference signal substantially becomes zero, are obtained for each recording bit; and a calculation step, in which the difference of each highest Curie temperature and each lowest Curie temperature for each recording bit is calculated, by a computer, as the distribution width of Curie temperatures of the plurality of magnetic grains that form the magnetic recording layer.

8. The estimation method of the Curie temperature distribution width according to claim 7, wherein in the heating step, each of a plurality of tracks is heated under one of a plurality of heating conditions having a different heating temperature, the plurality of tracks being in the magnetic recording medium and on each of which a reference signal is recorded;

in the measurement step, the signal intensities with respect to the reference signal in each of the tracks after heating is measured;

in the determining step, using the signal intensity with respect to the reference signal measured for each of the different heating temperatures in each of the tracks measured in each measurement step, the lowest Curie temperature of the plurality of magnetic grains and the highest Curie temperature are determined; and in the calculation step, the difference of the highest Curie temperature and the lowest Curie temperature for each of the plurality of tracks is calculated, by the computer, as the distribution width of Curie temperatures of the plurality of magnetic grains that form the magnetic recording layer.

9. The estimation method of the Curie temperature distribution width according to claim 7, wherein in the calculation step, the arithmetic mean value of the difference of each highest Curie temperature and each lowest Curie temperature for each recording bit is calculated, by the computer, as the distribution width of Curie temperatures of the plurality of magnetic grains that form the magnetic recording layer.

* * * * *